(12) United States Patent
Iriyama et al.

(10) Patent No.: US 6,849,511 B2
(45) Date of Patent: Feb. 1, 2005

(54) SEMICONDUCTOR DEVICE AND METHOD FOR FABRICATING THE SAME INCLUDING INTERCONNECTION OF TWO ELECTRODES

(75) Inventors: Yasunori Iriyama, Kawasaki (JP); Tetsuo Izawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/819,230

(22) Filed: Apr. 7, 2004

(65) Prior Publication Data

US 2004/0188726 A1 Sep. 30, 2004

Related U.S. Application Data

(62) Division of application No. 10/219,281, filed on Aug. 16, 2002, now Pat. No. 6,784,472, which is a continuation of application No. PCT/JP00/01838, filed on Mar. 24, 2000.

(51) Int. Cl.[7] .................. H01L 21/8234; H01L 21/336; H01L 21/3205
(52) U.S. Cl. ...................... 438/275; 438/197; 438/287; 438/585
(58) Field of Search ............................... 438/275, 195, 438/197, 287, 585, 592

(56) References Cited

U.S. PATENT DOCUMENTS

| | | | | |
|---|---|---|---|---|
| 5,391,510 A | * | 2/1995 | Hsu et al. ................... | 438/301 |
| 5,677,249 A | | 10/1997 | Fukui et al. ................ | 438/128 |
| 6,140,688 A | * | 10/2000 | Gardner et al. ............ | 257/412 |
| 6,171,910 B1 | | 1/2001 | Hobbs et al. .............. | 438/275 |
| 6,255,698 B1 | * | 7/2001 | Gardner et al. ............ | 257/369 |
| 6,284,578 B1 | | 9/2001 | Ni ............................. | 438/176 |
| 6,303,418 B1 | | 10/2001 | Cha et al. ................... | 438/199 |
| 6,333,223 B1 | | 12/2001 | Moriwaki et al. .......... | 438/241 |
| 6,333,527 B2 | | 12/2001 | Kim ........................... | 257/288 |
| 6,346,438 B1 | | 2/2002 | Yagishita et al. ........... | 438/197 |
| 6,406,956 B1 | * | 6/2002 | Tsai et al. ................... | 438/201 |
| 6,613,621 B2 | | 9/2003 | Uh et al. .................... | 438/183 |
| 6,696,333 B1 | * | 2/2004 | Zheng et al. ............... | 438/230 |
| 6,699,776 B2 | * | 3/2004 | Matsuoka et al. .......... | 438/585 |

FOREIGN PATENT DOCUMENTS

| | | |
|---|---|---|
| JP | 8-31931 | 2/1996 |
| JP | 9-321151 | 12/1997 |
| JP | 10-189914 | 7/1998 |
| JP | 10-189966 | 7/1998 |
| JP | 11-54509 | 2/1999 |
| JP | 11-74368 | 3/1999 |
| JP | 11-74369 | 3/1999 |
| JP | 11-243065 | 9/1999 |
| JP | 11-243150 | 9/1999 |

OTHER PUBLICATIONS

International Electron Device Meeting, "Technical Digest," 1998 pp. 777–780.

* cited by examiner

*Primary Examiner*—Richard Booth
*Assistant Examiner*—Ron Pompey
(74) *Attorney, Agent, or Firm*—Westerman, Hattori, Daniels & Adrian, LLP

(57) ABSTRACT

A semiconductor device comprises a first transistor 38*a* having a first gate electrode 22; a second transistor 38*b* having a second gate electrode 34 which is different from the first gate electrode; an insulation film 28 formed between the first gate electrode and the second gate electrode; and an interconnection electrode 44 buried in a concavity 42 formed in the first gate electrode, the second gate electrode and the insulation film and electrically interconnecting the first gate electrode and the second gate electrode. The interconnection electrode is buried in the concavity formed in the first gate electrode, the second gate electrode and the insulation film, and the interconnection electrodes electrically interconnects the first gate electrode and the second gate electrode, whereby the semiconductor device can have high integration and can be reliable.

6 Claims, 28 Drawing Sheets

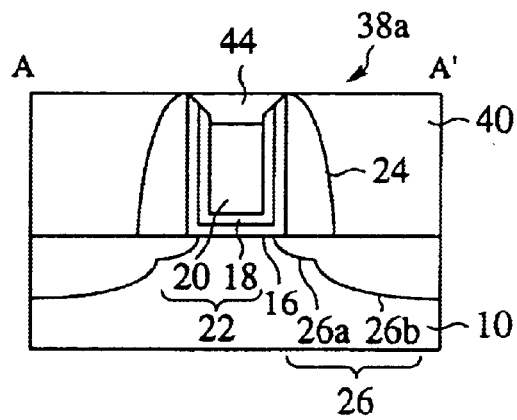
FIG. 13A
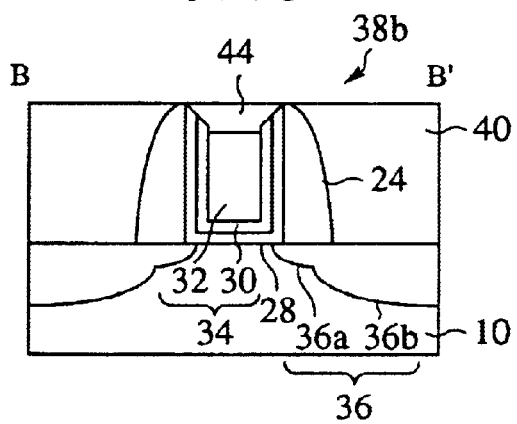
FIG. 13B
FIG. 13C
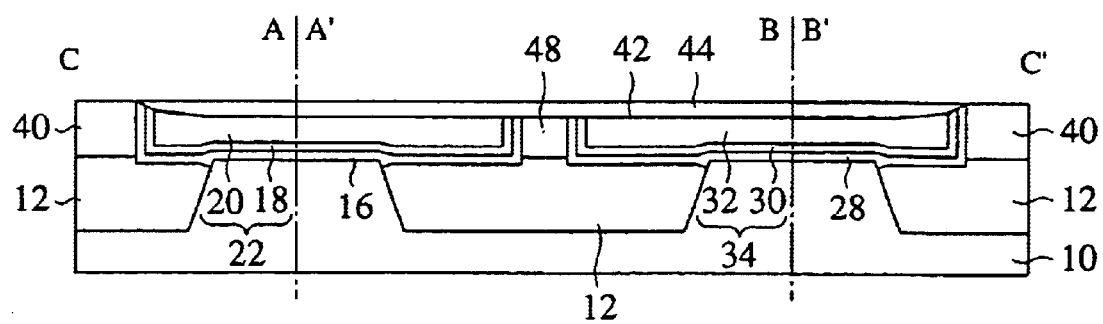

"PRIOR ART"

"PRIOR ART"

"RELATED ART"

"RELATED ART"

"RELATED ART"

SEMICONDUCTOR DEVICE AND METHOD FOR FABRICATING THE SAME INCLUDING INTERCONNECTION OF TWO ELECTRODES

CROSS REFERENCE TO RELATED APPLICATION

This application is a Divisional of prior U.S. application Ser. No. 10/219,281 filed on Aug. 16, 2002, now U.S. Pat. No. 6,784,472 which is a Continuation of PCT application No. PCT/JP00/01838, which was filed on Mar. 24, 2000, and which designated the United States.

TECHNICAL FIELD

The present invention relates to a semiconductor device and a method for fabricating the semiconductor device, more specifically a semiconductor device including the gate electrodes formed of a metal-based material and a method for fabricating the semiconductor device.

BACKGROUND ART

Recently, information amounts for electronic equipments to process are on increase, and larger-scale, higher speed semiconductor integrated circuits are required. This is accompanied by micronization and speed-up of semiconductor devices.

Conventionally, polysilicon has been widely used in the gate electrodes of MIS (Metal Insulator Semiconductor) transistors, and due to the high resistance of polysilicon, the gate electrodes have large signal delays. As semiconductor devices are more micronized, the signal delay of the gate electrodes becomes more serious. It is necessary to make the gate electrodes less resistant.

As techniques for making the gate electrodes less resistant, semiconductor devices of the polycide structure and the salicide (Self-Aligned Silicide) structure are proposed. Recently, as the semiconductor devices are further micronized, the gate electrodes are required to be less resistant.

To make the gate electrodes less resistant it is proposed to use metals as materials of the gate electrodes. The conventionally used processes cannot be used in cases of using metals as materials of the gate electrodes. When the gate electrodes are formed of a metal, the heat processing for activating the sources/drains often damages the gate electrodes or increases leak current of the gate insulation film.

A technique which can prohibit the gate electrode damage and the gate leak current increase even in a case the gate electrodes are formed of a metal is proposed in the specification of Japanese Patent Laid-Open Publication No. Hei 10-189966/1998 and International Electron Device Meeting, TECHNICAL DIGEST, 1998, p.777–780.

The proposed semiconductor device fabrication method will be explained with reference to FIGS. 24A to 25B. FIGS. 24A to 25B are sectional views of the semiconductor device in the steps of the fabrication method.

As shown in FIG. 24A, first dummy gate electrodes 148 are formed of polysilicon on a semiconductor substrate 110 with a dummy gate insulation film 146 formed therebetween. Next, a dopant is implanted shallowly in the semiconductor substrate by self-alignment with the dummy gate electrodes to form a shallow doped-region 136a. A sidewall insulation film 124 is formed on the side walls of the dummy gate electrodes 148. A dopant is implanted deeply in the semiconductor substrate by self-alignment with the dummy gate electrodes with the sidewall insulation film 124 formed on to form a deep doped-region 136b. Thus a source/drain diffused layer 136 is formed of the shallow doped-region 136a and the deep doped-region 136b. Next a high-temperature thermal processing is performed for activating the sources/drains.

Next, an inter-layer insulation film 140 is formed on the entire surface and planarized until the upper surfaces of the dummy gate electrodes 148 are exposed (see FIG. 24B).

Next, the dummy gate electrodes 148 and the dummy gate insulation film 146 are etched to form openings 156 down to the semiconductor substrate 110 (see FIG. 24C).

Then, an insulation film 128 is formed on the entire surface. Then, a TiN film 130 is formed on the entire surface (see FIG. 25A).

Next, the TiN film 130 and the insulation film 128 are polished by CMP (Chemical Mechanical Polishing) until the surface of the inter-layer insulation film 140 is exposed. Thus, the gate insulation film 128, and a gate electrode 134 of the TiN film are buried in the openings 156 (see FIG. 25B).

In the semiconductor device fabricated by the proposed fabrication method, after the high-temperature thermal processing for activating the sources/drains, the dummy gate electrodes and the dummy gate insulation film are etched, and then the gate insulation film and the gate electrodes are formed, whereby even in a case that the gate electrodes are formed of a metal, the gate electrode damage and gate leak current increase can be precluded.

On the other hand, recently semiconductor devices of the dual gate structure have been proposed as a technique which can realize low threshold voltages while depressing the short channel effect of the transistors. A semiconductor device of the dual gate structure is a semiconductor device having the gate electrodes of the p-channel MISFETs (Metal Insulator Semiconductor Field Effect Transistors) and the gate electrodes of the n-channel MISFETs formed of materials different from each other. Generally, the gate electrodes of the n-channel MISFETs are formed of n-type polysilicon, and the gate electrodes of the p-channel MISFETs are formed of p-type polysilicon. Semiconductor devices of such dual gate structure can realize low threshold volatges while depressing the short channel effect of the transistors, which is useful especially in semiconductor devices whose gate lengths are below 0.25 μm.

Here, it is considered to fabricate a semiconductor device of the dual gate structure by using the method shown in FIGS. 24A to 25B. FIG. 26 is a sectional view of the semiconductor device of the dual gate structure fabricated by using the proposed method.

As shown in FIG. 26, an element isolation region 112 for defining element regions is formed on a semiconductor substrate 110. An inter-layer insulation film 140 is formed on the semiconductor substrate 110 with the element isolation region 112 formed on.

A gate insulation film 116 and a gate electrode 122 of Pt are buried in the inter-layer insulation film 140 in a region 114a for a p-channel MISFET to be formed in. A gate insulation film 128 and a gate electrode 134 of TiN film are formed in the inter-layer insulation film 140 in a region 114b for an n-channel MISFET to be formed in. Thus, the gate electrode 122 of the p-channel MISFET 138a and the gate electrode 134 of the n-channel MISFET 138b form the semiconductor device using metal-based materials different from each other.

However, in the semiconductor device shown in FIG. 26, because of the gate insulation film 128 formed on the side wall of the gate electrodes 134, the gate electrode 122 and the gate electrode 134 are insulated from each other by the gate insulation film 128. Accordingly, the semiconductor device shown in FIG. 26 cannot normally operate.

Here, it is also considered to connect the gate electrode 122 and the gate electrode 134 by means of an interconnection electrode. FIG. 27 is a plan view of the semiconductor device having the gate electrodes interconnected with each other by means of the interconnection electrode.

As shown in FIG. 27, a contact region 122a is formed in the gate electrode 122, and a contact region 134a is formed in the gate electrode 134. A source/drain diffused layer 126 is formed in the semiconductor substrate on both sides of the gate electrode 122, and a source/drain diffused layer 136 is formed in the semiconductor substrate on both sides of the gate electrode 134.

An interconnection electrode 135 for interconnecting the contact region 122a and the contact region 134a is formed on the contact region 122a and the contact region 134a. The thus formed interconnection electrode 135 can electrically interconnect the gate electrode 122 and the gate electrode 134 with each other.

However, in the semiconductor device shown in FIG. 27, the contact regions 122a, 134a must be formed respectively in the gate electrode 122 and the gate electrode 134, which restricts the freedom degree of the design and makes it difficult to integrate the semiconductor device vertically as viewed in the drawing. Thus, the semiconductor device shown in FIG. 27 ignores the original significance of providing a micronized semiconductor device.

Furthermore, the gate electrodes tend to be more micronized, which makes it very difficult to align the interconnection electrode with the gate electrodes. Specifically, the alignment precision is about 100 to 150 nm in the current fabrication process, and it is very difficult to securely interconnect the gate electrodes with each other by the interconnection electrode of, e.g., an about 150 nm-width. This makes the interconnection between the interconnection electrode and the gate electrode defective, which leads to lower fabrication yields of the semiconductor device.

In a case that the gate electrodes are connected to each other by the interconnection electrode, as shown in FIG. 28, the interconnection electrodes 135 is projected beyond the surface of the inter-layer insulation film 140. That is, cavities and concavities are generally formed. Accordingly, in fabricating a semiconductor device of a multi-layer structure, defective wiring, etc. tend to take place above the interconnection electrode 135, which leads to a factor for lower fabrication yields of the semiconductor device.

An object of the present invention is to provide a semiconductor device having the gate electrodes of transistors of different conduction types from each other formed of different metal-based materials from each other, which can be fabricated with improved integration and improved yields, and a method for fabricating the semiconductor device.

DISCLOSURE OF THE INVENTION

The above-described object is achieved by a semiconductor device comprising: a first transistor having a first gate electrode; a second transistor having a second gate electrode which is different from the first gate electrodes; an insulation film formed between the first gate electrode and the second gate electrode; and an interconnection electrode buried in a concavity formed in the first gate electrode, the second gate electrode and the insulation film and electrically interconnecting the first gate electrode and the second gate electrode. The interconnection electrode is buried in the concavity formed in the first gate electrode, the second gate electrode and the insulation film to electrically interconnect the first gate electrode and the second gate electrode, whereby the semiconductor device can have higher integration and can be highly reliable.

The above-described object is achieved by a semiconductor device comprising: a first transistor having a first gate electrode; a second transistor having a second gate electrode which is different from the first gate electrodes; an insulation film formed between the first gate electrode and the second gate electrode; and an interconnection electrode buried in a concavity formed in the insulation film and electrically interconnecting the first gate electrode and the second gate electrode. The interconnection electrode is buried in the concavity formed in the insulation film to electrically interconnect the first gate electrode and the second gate electrode, whereby the semiconductor device can have high integration and can be highly reliable.

The above-described object is achieved by a method for fabricating a semiconductor device comprising the steps of: forming a dummy gate electrode in a first region and a second region on a semiconductor substrate; forming a first insulation film for covering the side wall of the dummy gate electrode on the semiconductor substrate; etching the dummy gate electrode in the first region to form in the first region a first opening down to the semiconductor substrate; forming a second insulation film in the first opening; forming a first gate electrode in the first opening with the second insulation film formed on; etching the dummy gate electrode in the second region to form in the second region a second opening down to the semiconductor substrate; forming a third insulation film in the second opening: forming a second gate electrode which is different from the first gate electrode in the second opening with the third insulation film formed on; removing top parts of the first gate electrode, the third insulation film and the second gate electrodes to form a concavity; and burying in the concavity an interconnection electrode electrically interconnecting the first gate electrode and the second gate electrode. The interconnection electrode is buried in the concavity formed in the first gate electrode, the second gate electrode and the insulation film to electrically interconnect the first gate electrode and the second gate electrode, whereby the semiconductor device can have higher integration and can be highly reliable.

The above-described object is achieved by a method for fabricating a semiconductor device comprising the steps of: forming a dummy gate electrode in a first region and a second region on a semiconductor substrate; forming a first insulation film for covering the side wall of the dummy gate electrode on the semiconductor substrate; etching the dummy gate electrode in the first region to form in the first region a first opening down to the semiconductor substrate; forming a second insulation film in the first opening; forming a first gate electrode in the first opening with the second insulation film formed on; etching the dummy gate electrode in the second region to form in the second region a second opening down to the semiconductor substrate; forming a third insulation film in the second opening: forming a second gate electrode which is different from the first gate electrode in the second opening with the third insulation film formed on; etching a top part of the third insulation film between the first gate electrode and the second gate electrode to form a concavity; and burying in the concavity an interconnection electrode for electrically interconnecting the first gate electrode and the second gate electrode. The interconnection electrode is buried in the concavity formed in the insulation film to electrically interconnect the first gate electrode and the second gate electrode, whereby the semiconductor device can have higher integration and can be highly reliable.

BRIEF DESCRIPTION OF THE DRAWINGS

FIGS. 13A to 13C are sectional views of the semiconductor device according to a modification of the first embodiment of the present invention, which explain the semiconductor device.

BEST MODES FOR THE CARRYING OUT THE INVENTION (A First Embodiment)

Figure 1A:
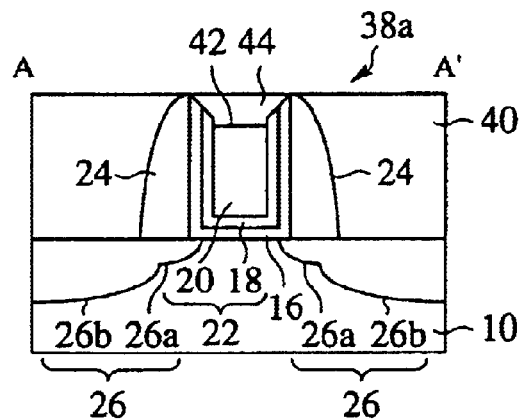
FIGS. 1A to 1C are sectional views of the semiconductor device according to a first embodiment of the present invention.
Figure 1B:
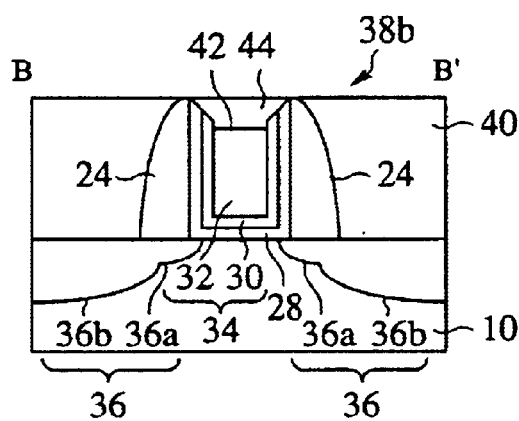
Figure 1C:
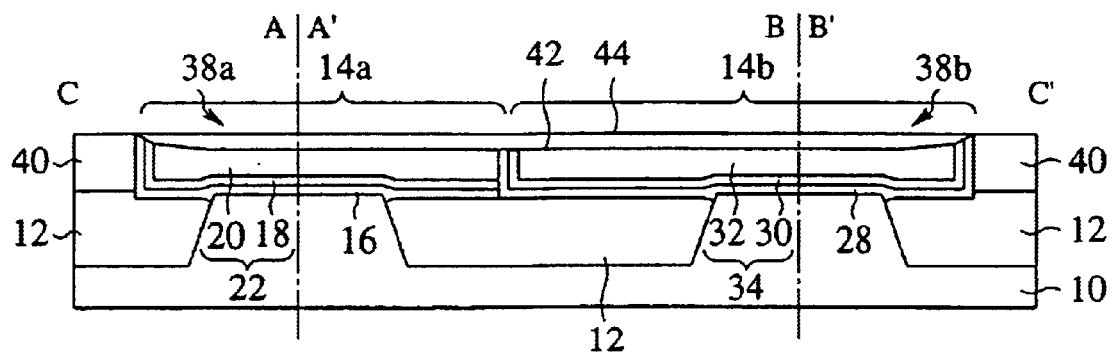
Figure 2:
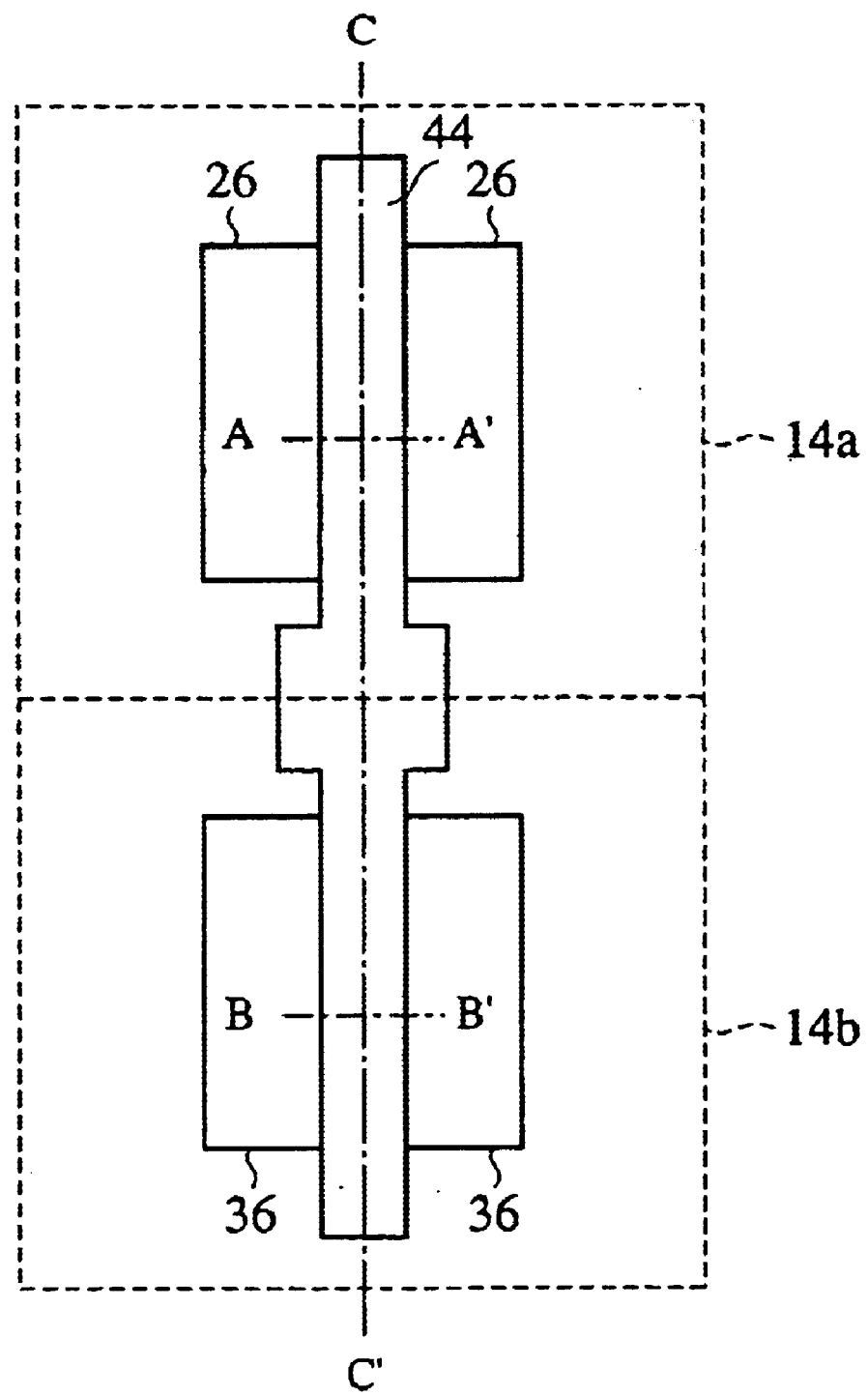
FIG. 2 is a plan view of the semiconductor device according to the first embodiment of the present invention.

The semiconductor device according to a first embodiment of the present invention will be explained with reference to FIGS. 1A to 12C. FIGS. 1A to 1C are sectional views of the semiconductor device according to the present embodiment. FIG. 2 is a plan view of the semiconductor device according to the present embodiment. FIGS. 3A to 12C are sectional views of the semiconductor device according to the present invention in the steps of the method for fabricating the same, which explain the method.

(The Semiconductor Device)

The semiconductor device according to the present embodiment will be explained with reference to FIGS. 1A to 2. FIG. 1A is the sectional view along the line A–A' in FIG. 2 and shows a p-channel MISFET. FIG. 1B is the sectional view along the line B–B' in FIG. 2 and shows an n-channel MISFET. FIG. 1C is the sectional view along the line C–C' in FIG. 2 and shows the sectional view along the gate electrode.

As shown in FIG. 1C, an element isolation region 12 for defining element regions is formed on a semiconductor substrate 10 of p-type silicon.

The region 14a on the left side of the drawing of FIG. 1C is a region for the p-channel MISFET to be formed in. The region 14b on the right side of the drawing of FIG. 1C is a region for the n-channel MISFET to be formed in.

In the region 14a for the p-channel MISFET to be formed in, as shown in FIG. 1A, an insulation film 16 of a 1 nm-thickness $SiO_2$ film and a 5 nm-thickness $Ta_2O_5$ film is formed.

A 10 nm-thickness Pt film 18 is formed on the insulation film 16. A 110 to 135 nm-thickness tungsten (W) film 20 is formed on the Pt film 18. A film thickness of the tungsten film 20 is, e.g., 114 nm. The Pt film 18 and the tungsten film 20 form the gate electrode 22 of the p-channel MISFET.

The insulation film 16 is formed also on the side wall of the gate electrode 22. The insulation film 16 functions also as the gate insulation film of the p-channel MISFET. A sidewall insulation film 24 is formed on the side wall of the insulation film 16.

A shallow doped-region 26a doped shallow with a p-type dopant is formed in the semiconductor substrate 10 on both sides of the gate electrode 22. A deep doped-region 26b doped deep with an p-type dopant is formed in the semiconductor substrate 10 on both sides of the gate electrode 22 with the sidewall insulation film 24 formed on. The shallow doped-region 26a and the deep doped-region 26b formed a source/drain diffused layer 26.

On the other hand, in the region 14b for the n-channel MISFET to be formed in, as shown in FIG. 1B, an insulation film 28 of a 1 nm-thickness $SiO_2$ film and a 5 nm-thickness $Ta_2O_5$ film is formed.

A 10 nm-thickness TiN film 30 is formed on the insulation film 28. A 110 to 135 nm-thickness tungsten film 32 is formed on the TiN film 30. A thickness of the tungsten film 32 is, e.g., 114 nm. The TiN film 30 and the tungsten film 32 form the gate electrode 34 of the n-channel MISFET.

The insulation film 28 is formed also on the side wall of the gate electrode 34. The insulation film 34 functions as the gate insulation film of the n-channel MISFET. A sidewall insulation film 24 is formed on both sides of the insulation film 28.

In the semiconductor substrate 10 on both sides of the gate electrode 34, a shallow doped-region 36a doped shallow with an n-type dopant is formed. A deep doped-region 36b doped deep with an n-type dopant is formed in the semiconductor substrate 10 on both sides of the gate electrode 34 with the sidewall insulation film 24 formed on. The shallow doped-region 36a and the deep doped-region 36 form a source/drain diffused layer 36.

The p-channel MISFET 38a and the n-channel MISFET 38b having such structures are buried in an inter-layer insulation film 40 of a 150 nm-thickness $SiO_2$.

As shown in FIG. 1C, the gate insulation film 28 is formed between the gate electrode 22 and the gate electrode 34.

A concavity 42 is formed in the top parts of the gate electrodes 22, 34 and the insulation film 28. An interconnection electrode 44 of TiN film is buried in the concavity 42.

As shown in FIG. 1C, the gate electrode 22 and the gate electrode 34 are electrically connected with each other by the interconnection electrode 44.

The semiconductor device according to the present embodiment has such structure.

(Method for Fabricating the Semiconductor Device)

Next, the method for fabricating the semiconductor device will be explained with reference to FIG. 3A to FIG. 12C.

Figure 3A:
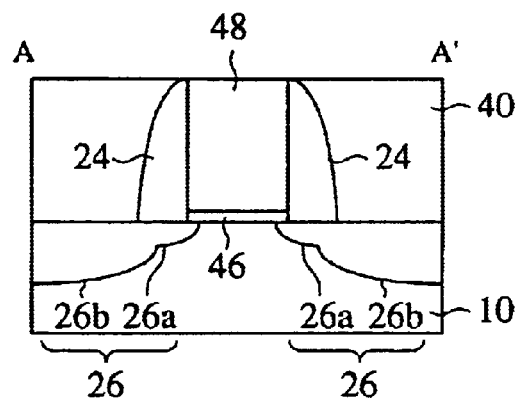
FIGS. 3A to 3C are sectional views of the semiconductor device according to the first embodiment of the present invention in the steps of the method for fabricating the same, which explain the method (Part 1).
Figure 3B:
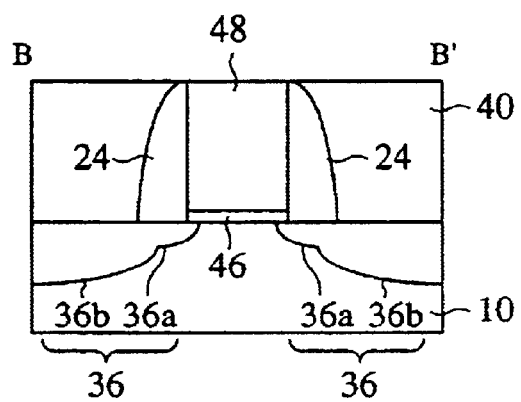
Figure 3C:
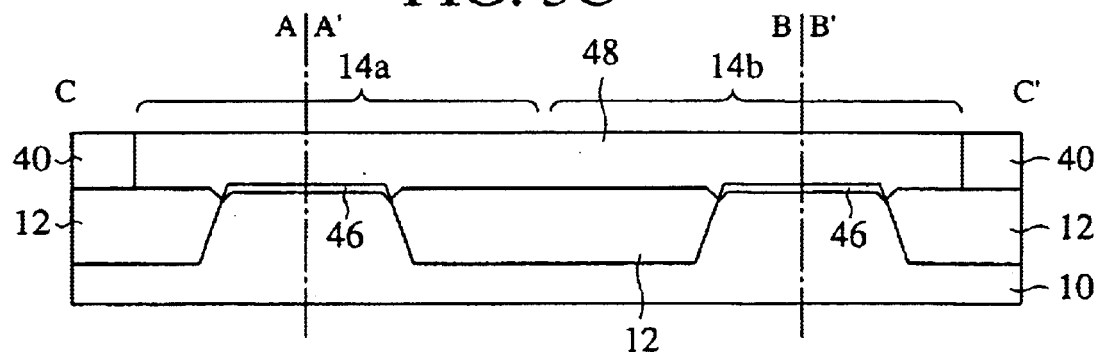
Figure 4A:
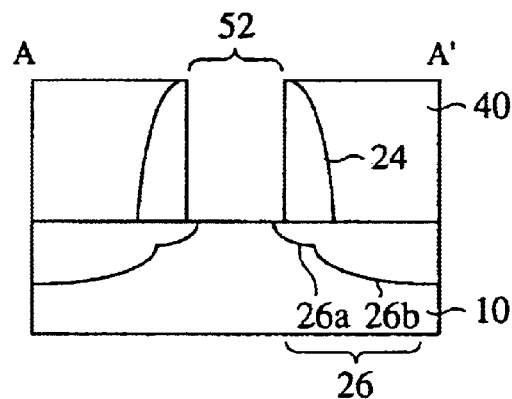
FIGS. 4A to 4C are sectional views of the semiconductor device according to the first embodiment of the present invention in the steps of the method for fabricating the same, which explain the method (Part 2).
Figure 4B:
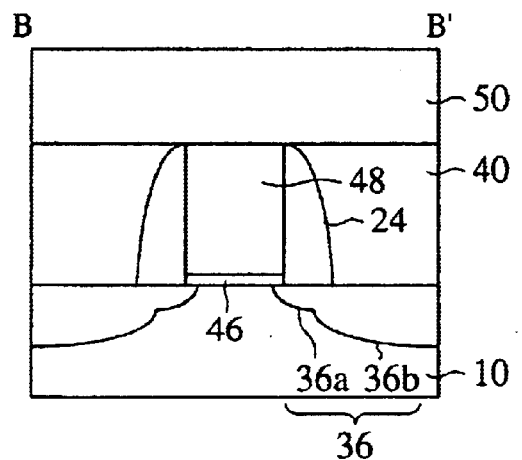
Figure 4C:
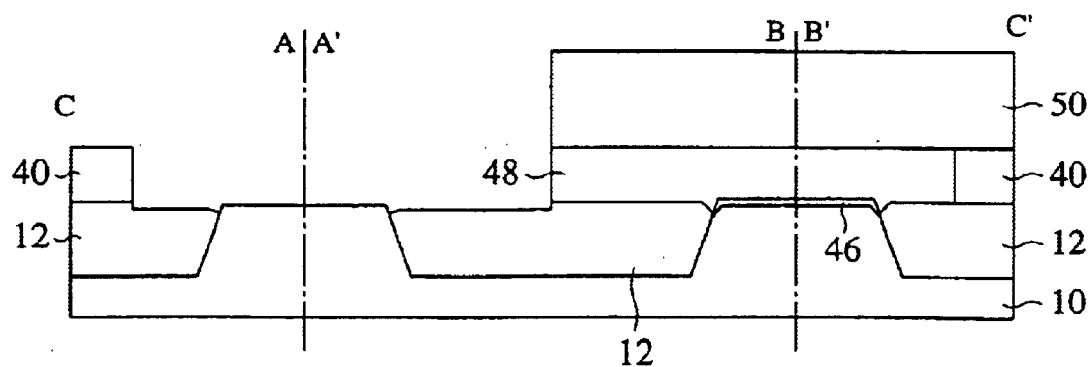

As shown in FIGS. 3A to 3C, first, the element isolation region 12 for defining element regions is formed on a semiconductor substrate 10 of p-type silicon by high density plasma CVD.

Next, a dummy gate insulation film 46 of a 5 nm-thickness $SiO_2$ is formed by thermal oxidation.

Then, a 200 nm-thickness polysilicon film is formed by CVD. Then, the polysilicon film is etched by photolithography to form a dummy gate electrode 48 of the polysilicon.

Next, a photoresist mask (not shown) exposing the region 14a for the p-channel MISFET to be formed in is formed. Then, with the photoresist mask as a mask, a p-type dopant is implanted shallow into the semiconductor substrate 10 by self-alignment with the dummy gate electrode 48. Thus, the shallow doped-region 26a is formed in the semiconductor substrate 10 on both sides of the dummy gate electrode 48. The p-type dopant can be, e.g., B (boron), $BF_2$ or others.

Next, a photoresist mask (not shown) exposing the region 14b for the n-channel MISFET to be formed in is formed. Then, with the photoresist mask as a mask, an n-type dopant is implanted shallow into the semiconductor substrate 10 by self-alignment with the dummy gate electrode 48. Thus, the shallow doped-region 36a is formed in the semiconductor substrate 10 on both sides of the dummy gate electrode 48. The n-type dopant can be, e.g., P (phosphorus), As (Arsenic) or others.

Then, a 60 nm-thickness $Si_3N_4$ is formed on the entire surface. Then, the $Si_3N_4$ film is anisotropically etched to form the sidewall insulation film 24 of the $Si_3N_4$ on the side wall of the dummy gate electrode 48.

Then, a photoresist mask (not shown) exposing the region 14a for the p-channel MISFET to be formed in is formed. Then, with the photoresist mask as a mask, a p-type dopant is implanted deep into the semiconductor substrate 10 by self-alignment with the dummy gate electrode 48 with the sidewall insulation film 24 formed on. Thus, the deep doped-region 26b is formed in the semiconductor substrate 10 on both sides of the gate electrode 48 with the sidewall insulation film 24 formed on. Thus, the shallow doped-region 26a and the deep doped-region 26b form the source/drain diffused layer 26.

Next, a photoresist mask (not shown) exposing the region 14b for the n-channel MISFET to be formed in is formed. With the photoresist mask as a mask, an n-type dopant is implanted deep into the semiconductor substrate 10 by self-alignment with the dummy electrode 48 with the sidewall insulation film 24 formed on. Thus, the deep doped-region 36b is formed in the semiconductor substrate 10 on both sides of the dummy gate electrode 48 with the sidewall insulation film 24 formed on. Thus, the shallow doped-region 36a and the deep doped-region 36b form the source/drain diffused layer 36.

Then, thermal processing for activating the source/drain diffused layers 26, 36 is performed.

Then, the inter-layer insulation film 40 of an about 500 nm-thickness $SiO_2$ is formed on the entire surface by high density plasma CVD. Then, the inter-layer insulation film 40 is polished by CMP until the surface of the dummy gate electrode 48 is exposed.

Next, a photoresist mask 50 for covering the region 14b for the n-channel MISFET to be formed in is formed. Then, with the photoresist mask 50 as a mask, the dummy gate electrode 48 and the dummy gate insulation film 46 are etched. Thus, an opening 52 is formed down to the semiconductor substrate 10 (see FIGS. 4A and 4C).

Next, a 1 nm-thickness $SiO_2$ film is formed on the entire surface by CVD. Next, a 5 nm-thickness $Ta_2O_5$ film is formed on the entire surface by CVD. Thus, the insulation film 16 is formed of the $SiO_2$ film and the $Ta_2O_5$ film.

Next, a 10 nm-thickness Pt film 18 is formed on the entire surface by sputtering.

Figure 5A:
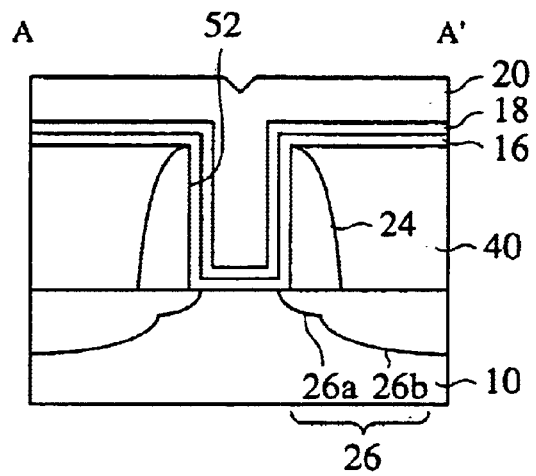
FIGS. 5A to 5C are sectional views of the semiconductor device according to the first embodiment of the present invention in the steps of the method for fabricating the same, which explain the method (Part 3).
Figure 5B:
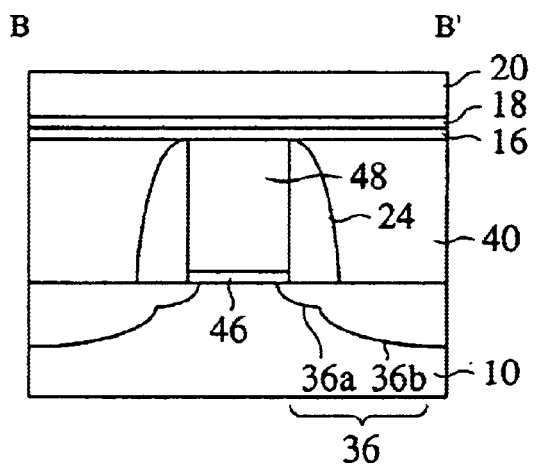
Figure 5C:
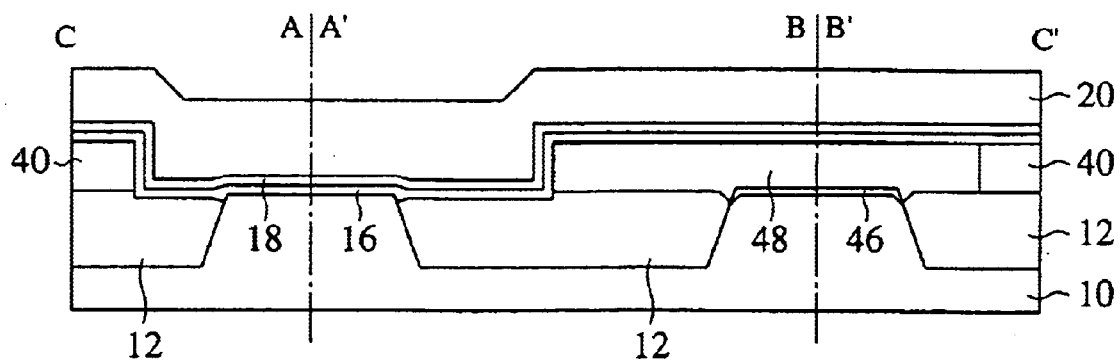

Then, a 300 nm-thickness tungsten film 20 is formed on the entire surface by CVD (see FIGS. 5A and 5C).

Then, the tungsten film 20, the Pt film 18 and the insulation film 16 are polished by CMP until the surface of the inter-layer insulation film 40 is exposed. Thus, the insulation film 16 of the $SiO_2$ film and the $Ta_2O_5$ film, and the gate electrode 22 of the Pt film and the tungsten film are buried in the opening 52.

Figure 6A:
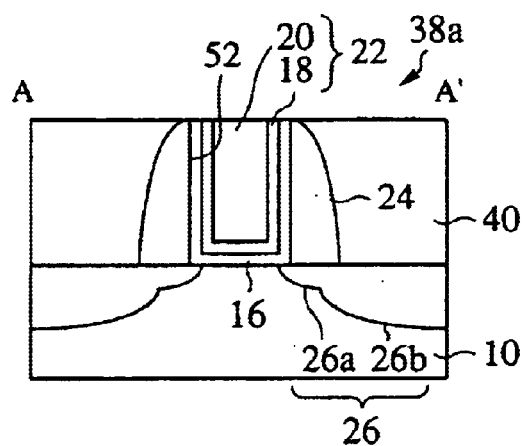
FIGS. 6A to 6C are sectional views of the semiconductor device according to the first embodiment of the present invention in the steps of the method for fabricating the same, which explain the method (Part 4).
Figure 6B:
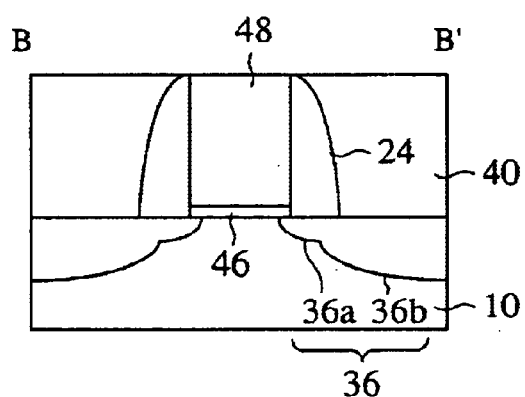
Figure 6C:
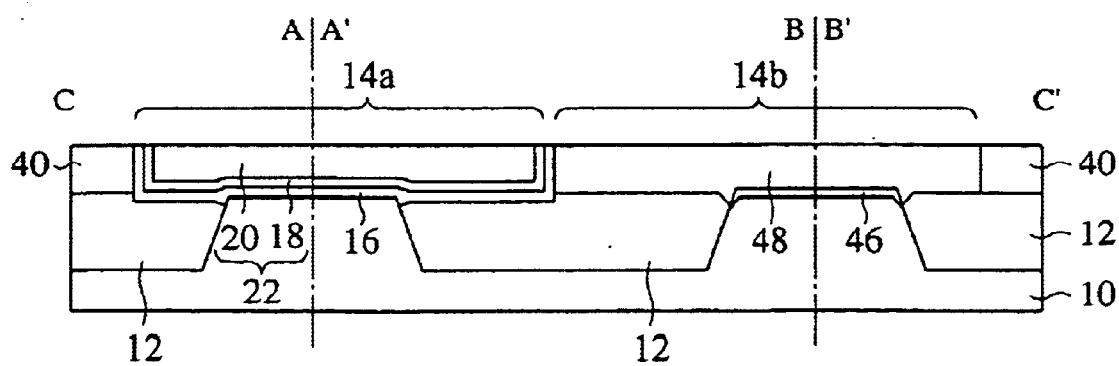
Figure 7A:
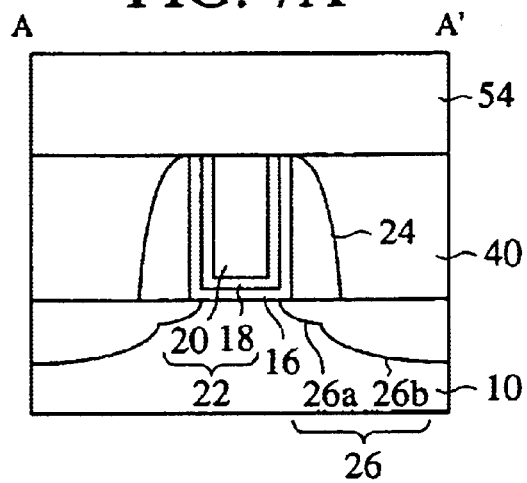
FIGS. 7A to 7C are sectional views of the semiconductor device according to the first embodiment of the present invention in the steps of the method for fabricating the same, which explain the method (Part 5).
Figure 7B:
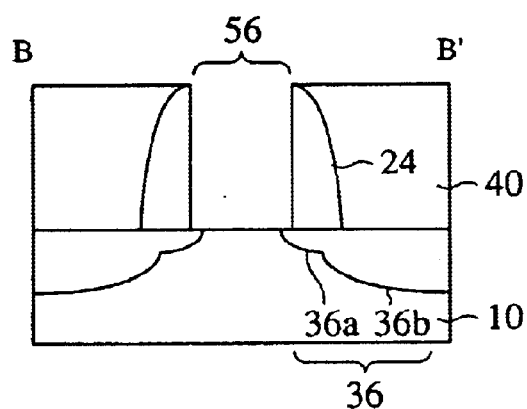
Figure 7C:
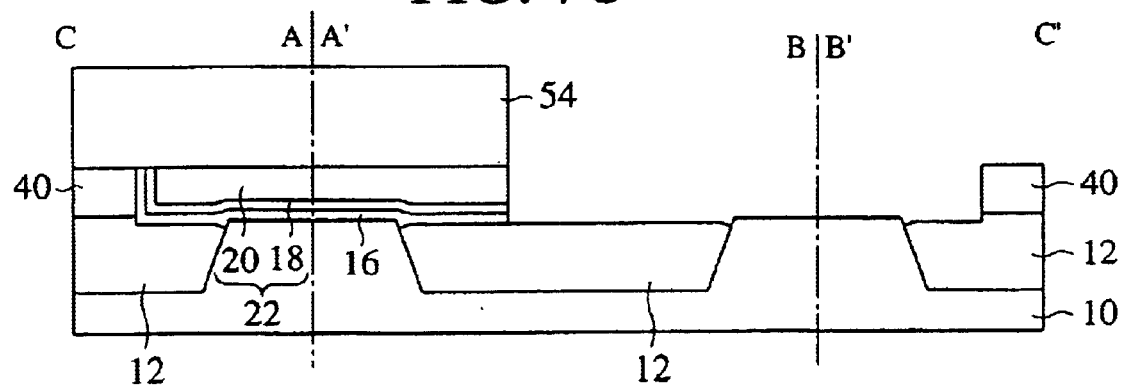

Thus, the p-channel MISFET 38a having the gate electrode 22 of the Pt film 18 and the tungsten film 20 is formed (see FIGS. 6A and 6C).

Next, a photoresist mask 54 for covering the region 14a for the p-channel MISFET to be formed in is formed. Then, with the photoresist mask 54 as a mask, the dummy gate electrode 48 and the dummy gate insulation film 46 are etched. Thus, an opening 56 is formed down to the semiconductor substrate 10 (see FIGS. 7A and 7C).

Next, a 1 nm-thickness $SiO_2$ film is formed on the entire surface by CVD. Then, a 5 nm-thickness $Ta_2O_5$ film is formed on the entire surface by CVD. Thus, the insulation film 28 of the $SiO_2$ film and the $Ta_2O_5$ film is formed.

Next, the TiN film 30 of a 10 nm-thickness is formed on the entire surface by CVD.

Figure 8A:
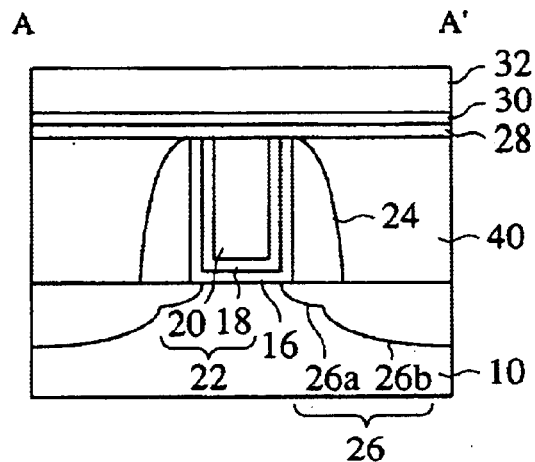
FIGS. 8A to 8C are sectional views of the semiconductor device according to the first embodiment of the present invention in the steps of the method for fabricating the same, which explain the method (Part 6).
Figure 8B:
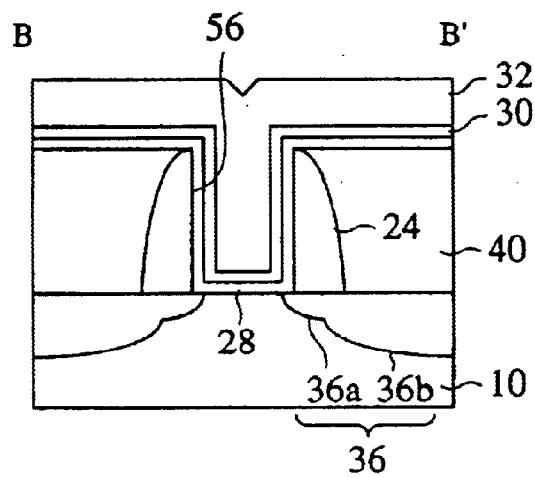
Figure 8C:
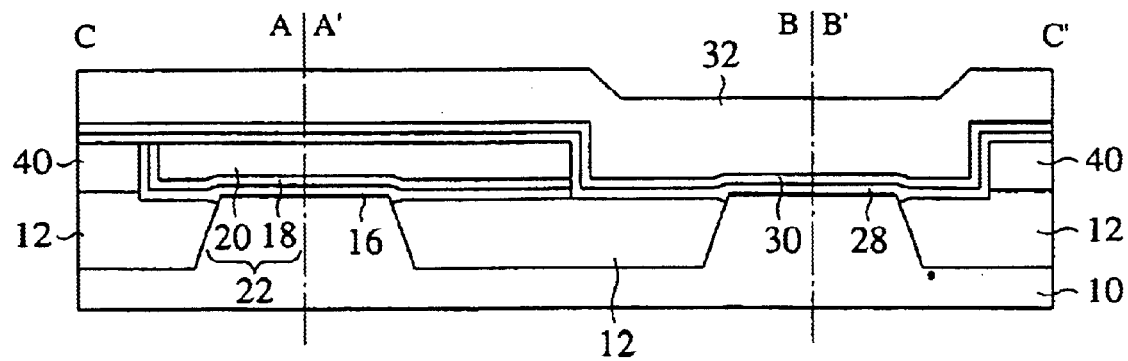

Next, the tungsten film 32 of a 300 nm-thickness is formed on the entire surface by CVD (see FIGS. 8A and 8C).

Then, the tungsten film 32, the TiN film 30 and the insulation film 28 are polished by CMP until the surface of the inter-layer insulation film 40 is exposed. Thus, the insulation film 28 of the $SiO_2$ film and the $Ta_2O_5$ film, the gate electrode 34 of the TiN film 30 and the tungsten film 32 are buried in the opening 56.

Figure 9A:
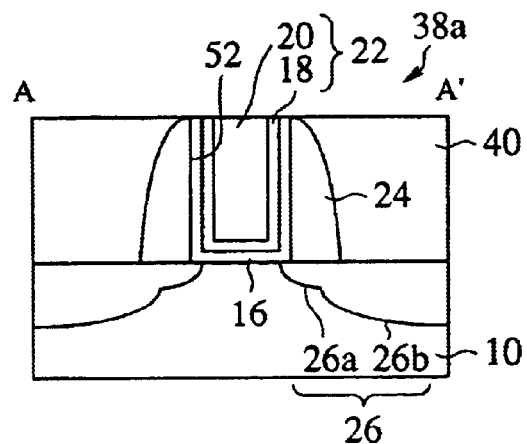
FIGS. 9A to 9C are sectional views of the semiconductor device according to the first embodiment of the present invention in the steps of the method for fabricating the same, which explain the method (Part 7).
Figure 9B:
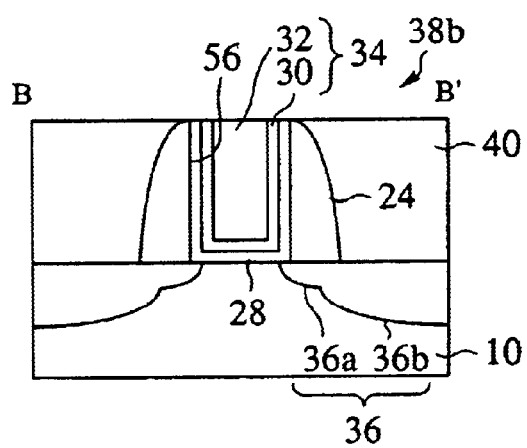
Figure 9C:
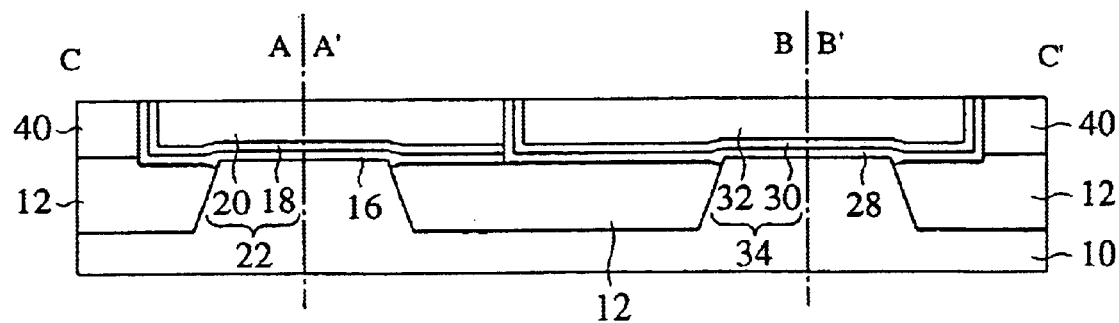

Thus, the n-channel MISFET 38b having the gate electrode 34 of the TiN film 30 and the tungsten film 32 is formed (see FIGS. 9A and 9C).

Next, the gate electrodes 22, 34 and the insulation films 16, 28 are polished by CMP to thereby form the concavity 42 of an about 20 nm-depth from the surface of the inter-layer insulation film 40. A polishing agent is, e.g., silica as grains, and hydrogen peroxide as an oxidation agent. Such polishing agent can highly selectively polish the tungsten films 20, 32 to thereby to form the concavity 42 (see FIGS. 10A and 10C).

Figure 11A:
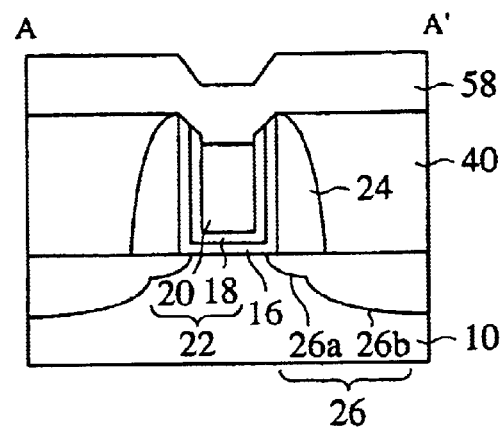
FIGS. 11A to 11C are sectional views of the semiconductor device according to the first embodiment of the present invention in the steps of the method for fabricating the same, which explain the method (Part 9).
Figure 11B:
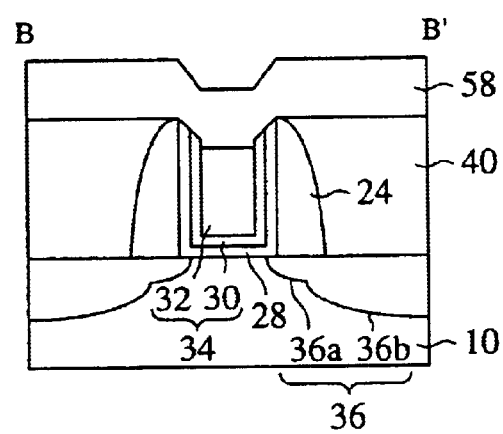
Figure 11C:
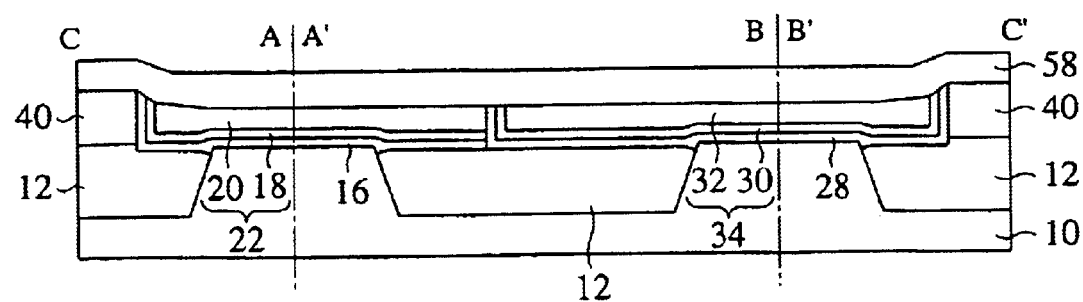

Then, the TiN film 58 of a 100 nm-thickness is formed on the entire surface by sputtering (see FIGS. 11A to 11C).

Next, the TiN film 58 is polished by CMP until the inter-layer insulation film 40 is exposed. A polishing agent is, e.g., one containing alumina as a main component. A rotation number of the platen is, e.g., 50 rpm, and a rotation number of the head is, e.g., 50 rpm. A pressing pressure to the side of the main is, e.g., 4.0 psi (pounds per square inch), and a pressing force to the side of the back is, e.g., 3.5 psi.

Thus, the interconnection electrode 44 of the TiN film 58 is buried in the concavity 42.

The semiconductor device according to the present embodiment is thus fabricated.

The semiconductor device according to the present embodiment is characterized mainly in that the interconnection electrode 44 is buried in the concavity 42 formed in the gate electrodes 22, 34 and the gate insulation film 28. In the semiconductor device shown in FIG. 27, in order to interconnect the gate electrode and the gate electrode with each other, the contact regions must be provided respectively in the gate electrodes, which is a factor for hindering the integration. In the semiconductor device according to the present embodiment, the interconnection electrode 44 is buried in the concavity 42 formed in the gate electrodes 22, 34 and the insulation film 28, electrically interconnecting the gate electrode 22 and the gate electrodes 34 with each other, which is beneficial to the integration of the semiconductor device.

Figure 27:
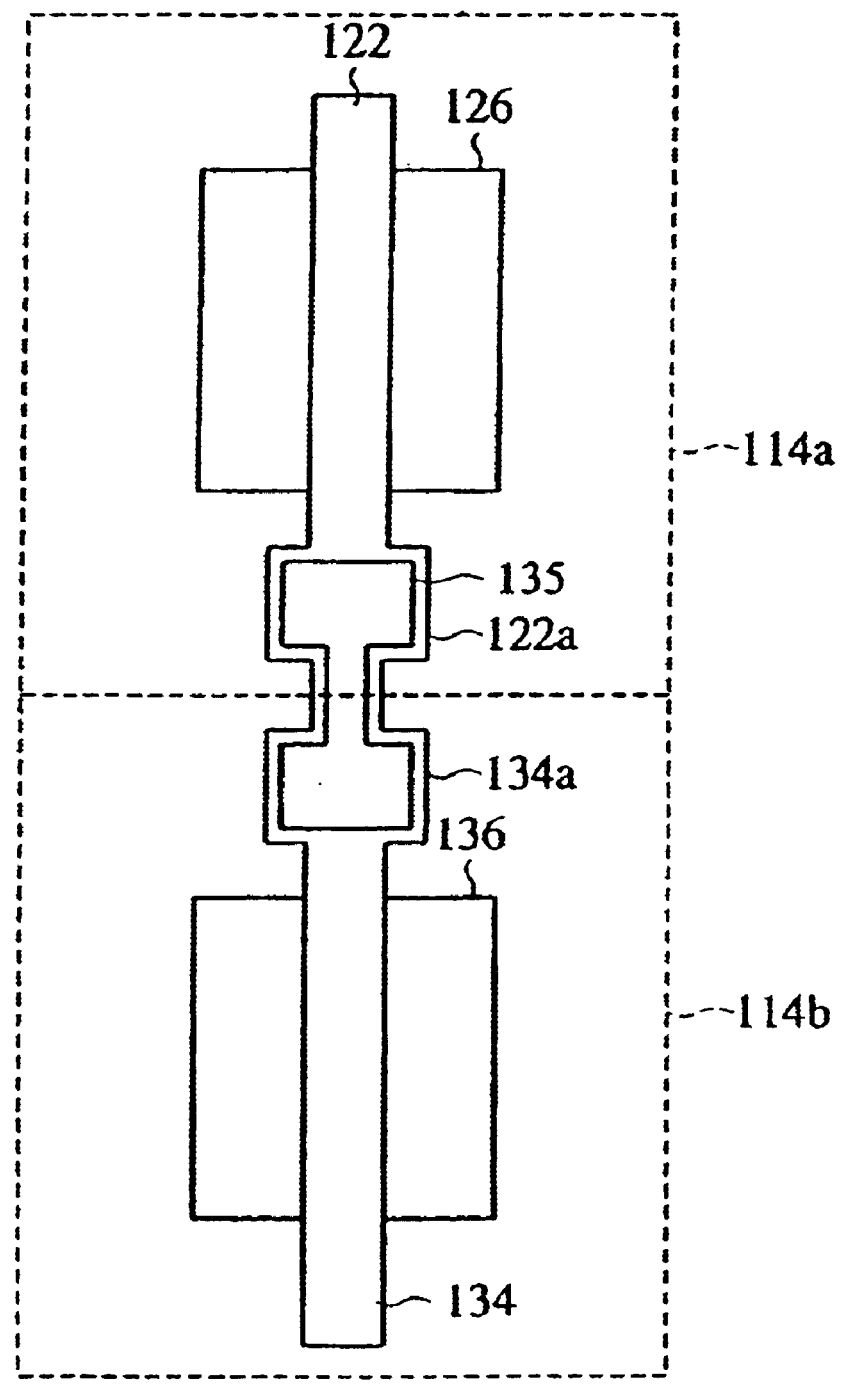
FIG. 27 is a plan view of the semiconductor device having the gate electrodes interconnected by an interconnection gate.

In the semiconductor device shown in FIG. 27, the alignment error taking place in forming the interconnection electrode causes defective interconnection, which often lowers fabrication yields of the semiconductor device. In the present embodiment, however, the interconnection electrode 44 is may be buried in the concavity 42 formed in the gate electrodes 22, 34 and the insulation film 28, which makes the alignment for forming the interconnection electrode 44 unnecessary. Thus, according to the present embodiment, the semiconductor device can be micronized at high yields.

Figure 28:
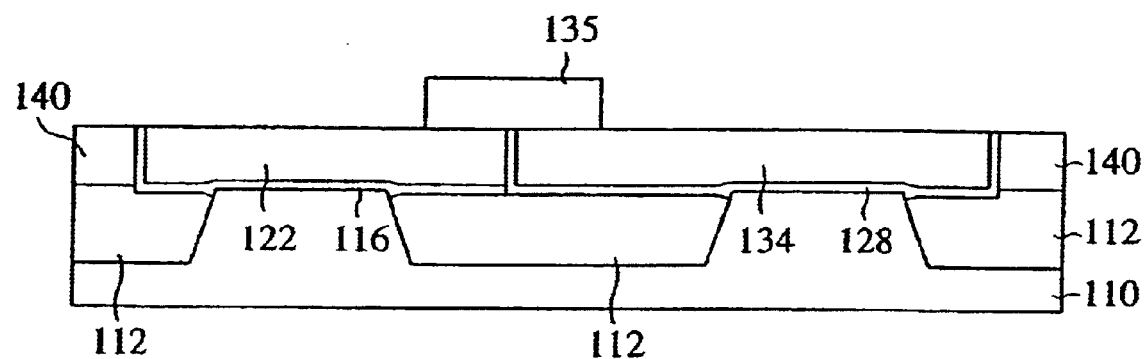
FIG. 28 is a sectional view of the semiconductor device having the gate electrodes interconnected by the interconnection electrode.

Furthermore, according to the present embodiment, the interconnection electrode 44 is buried in the concavity 42 formed in the gate electrodes 22, 34 and the insulation film 28, and accordingly, the interconnection electrode is never projected beyond the interconnection insulation film, as is in the semiconductor device shown in FIG. 28. Thus, according to the present embodiment, the formation of concavities and convexities with respect to the surface of the inter-layer insulation film can be precluded. This leads to the fabrication of the semiconductor device of the multi-layer structure having high reliability at high yields.

(Modification)

Figure 14A:
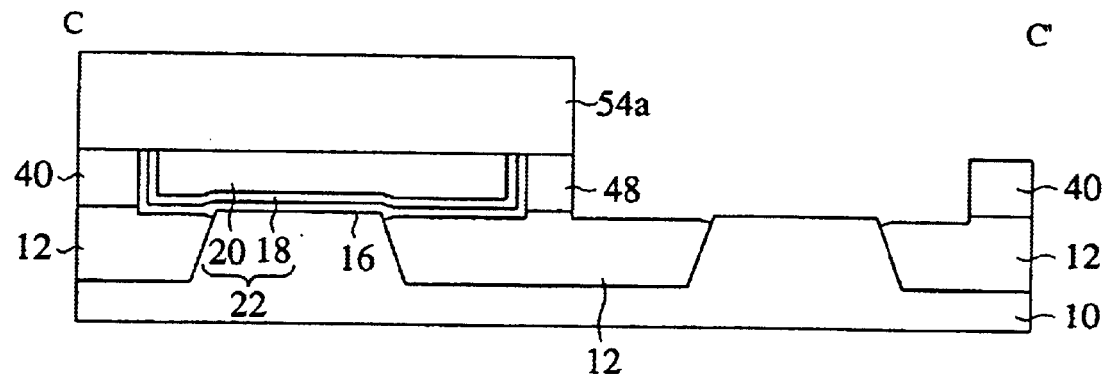
FIGS. 14A to 14C are sectional views of the semiconductor device according to the modification of the first embodiment of the present invention in the steps of the method for fabricating the same, which explain the method.
Figure 14B:
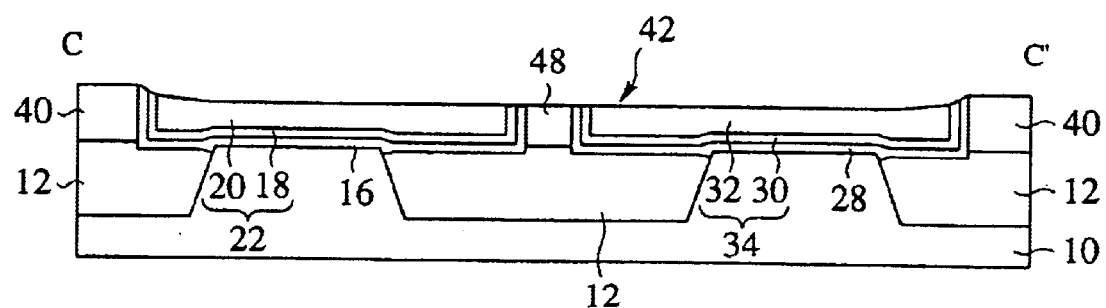
Figure 14C:
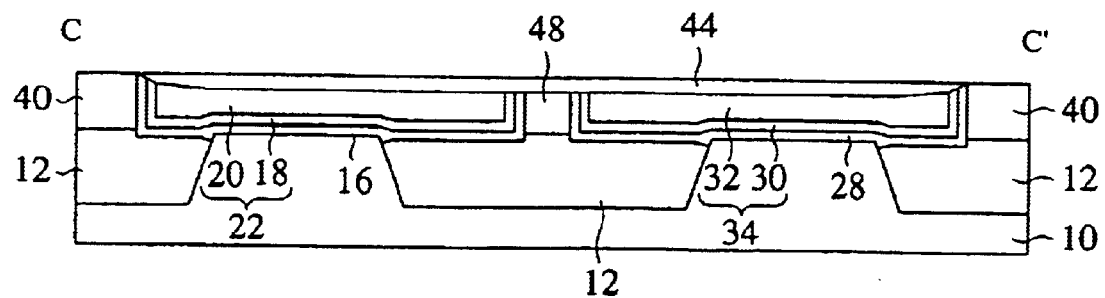

Next, a modification of the semiconductor device according to the present embodiment and the method for fabricating the semiconductor device will be explained with reference to FIG. 13A to FIG. 14C. FIG. 13A to FIG. 13C are sectional views of the semiconductor device according to the present embodiment. FIGS. 14A to 14C are sectional views of the semiconductor device according to the present embodiment in the steps of the method for fabricating the same, which show the method.

First, the semiconductor device according to the present modification will be explained.

As shown in FIGS. 13A to 13C, the semiconductor device according to the present modification is characterized mainly in that a dummy gate electrode 48 is left between the gate electrode 22 and the gate electrode 34.

Even in the case that the dummy gate electrode 48 is thus left between the gate electrodes 22 and the gate electrode 34, a concavity 42 is formed on the top parts of the gate electrodes 22, 34, the insulation films 16, 28 and the dummy gate electrode 48, and the interconnection electrode 44 is buried in the concavity 42. The same semiconductor device as the semiconductor device according to the first embodiment shown in FIG. 1 can be provided.

Next, the method for fabricating the semiconductor device according to the present modification will be explained with reference to FIGS. 14A to 14C. FIGS. 14A to 14C are the sectional views along the line C–C' in FIG. 2.

The method for fabricating the semiconductor device according to the present modification is the same up to the step of forming the gate electrode 22 including the step as in the method for fabricating the semiconductor device according to the first embodiment shown in FIGS. 3A to 6C, and the explanation of the method up to the step is not repeated.

Next, a photoresist mask 54a for covering a region 14a for a p-channel MISFET to be formed in is formed. With the photoresist mask 54a as a mask, the dummy gate electrode 48 and the dummy gate insulation film 46 are etched. As shown in FIG. 14A, because of the photoresist mask 54a formed not only on the gate electrode 22 and but also on a part of the upper surfaces of the dummy gate electrode 48, the part of the dummy gate electrode 48 is left when the dummy gate electrode 58 is etched.

The following steps up to the step of forming the gate electrode 34 including the step are the same as in the method for fabricating the semiconductor device according to the first embodiment shown in FIGS. 8A to 9C, and their explanation is not repeated.

Figure 10A:
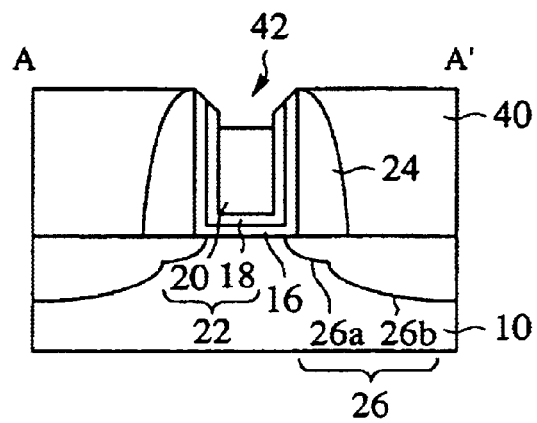
FIGS. 10A to 10C are sectional views of the semiconductor device according to the first embodiment of the present invention in the steps of the method for fabricating the same, which explain the method (Part 8).
Figure 10B:
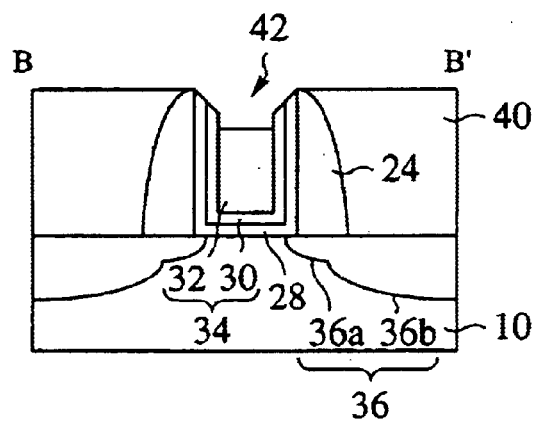
Figure 10C:
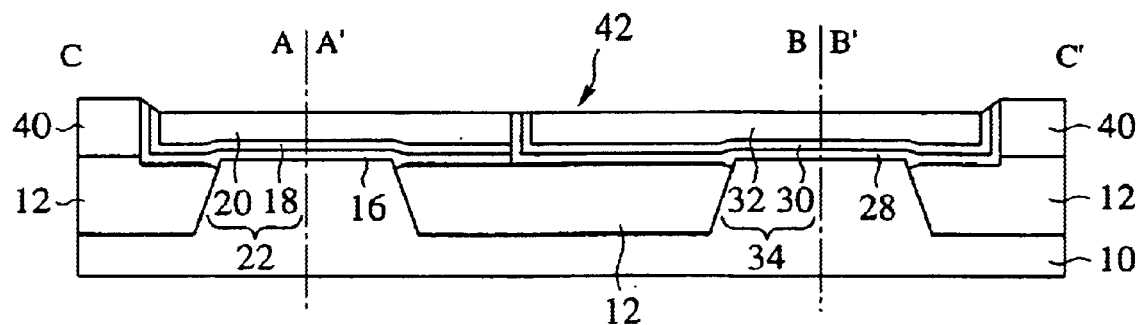

Next, in the same was as in the method for fabricating the semiconductor device according to the first embodiment shown in FIGS. 10A to 10C, the top parts of the gate electrodes 22, 34, the insulation films 16, 28 and the dummy gate electrode 48 are polished to form the concavity 42 (see FIG. 14B).

The following step of forming a TiN film 58 is the same as in the method for fabricating the semiconductor device according to the first embodiment shown in FIGS. 11A to 11C, and its explanation is not repeated.

Figure 12A:
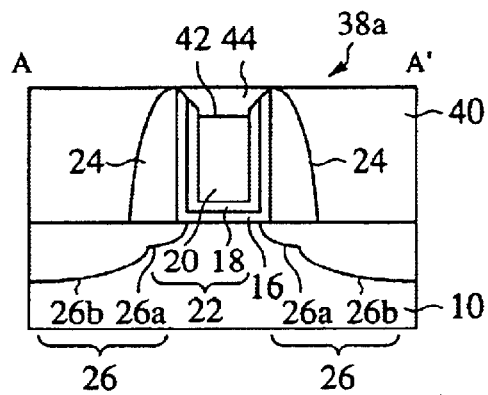
FIGS. 12A to 12C are sectional views of the semiconductor device according to the first embodiment of the present invention in the steps of the method for fabricating the same, which explain the method (Part 10).
Figure 12B:
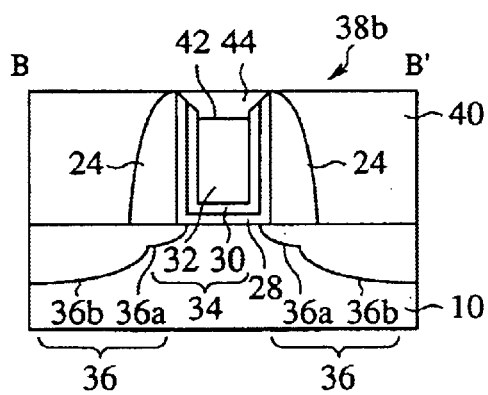
Figure 12C:
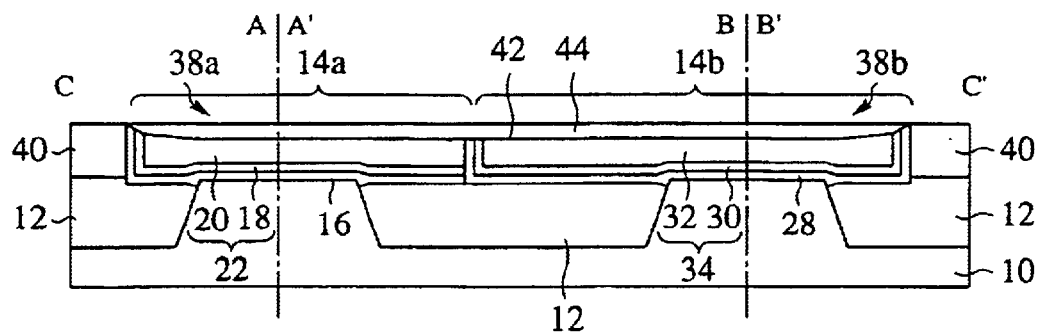

Next, in the same way as in the method for fabricating the semiconductor device according to the first embodiment shown in FIGS. 12A to 12C, the interconnection electrode 44 of the TiN film 58 is buried in the concavity 42. Thus, the semiconductor device according to the present modification is fabricated (see FIG. 14C).

As described above, according to the present modification, even in a case that the dummy gate electrode 48 is left between the gate electrode 22 and the gate electrode 34, the same semiconductor device as that according to the first embodiment can be provided.

(A Second Embodiment)

Figure 15A:
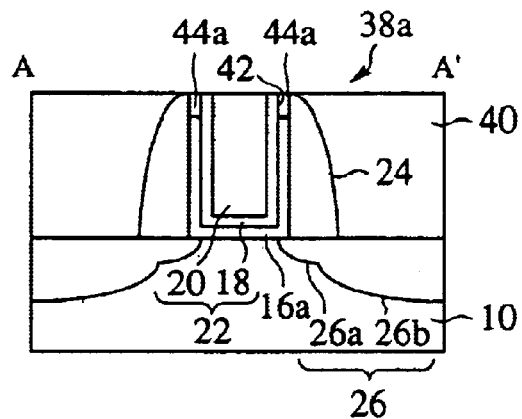
FIGS. 15A to 15C are sectional views of the semiconductor device according to a second embodiment of the present invention.
Figure 15B:
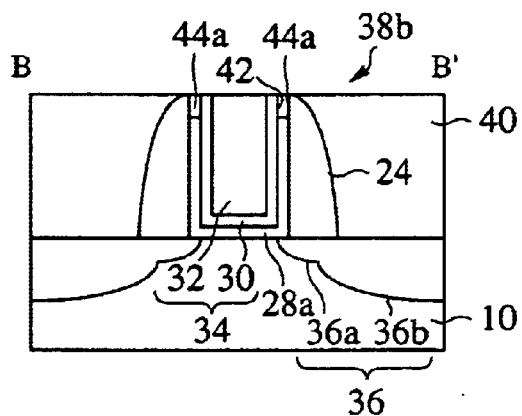
Figure 15C:
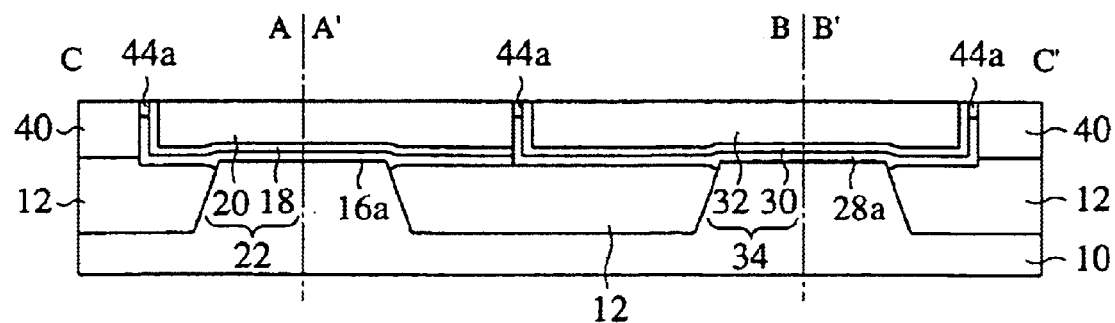

The semiconductor device according to a second embodiment of the present invention and the method for fabricating the semiconductor device will be explained with reference to FIG. 15. FIGS. 15A to 15C are sectional views of the semiconductor device according to the present embodiment, which explain the semiconductor device. FIGS. 16A to 20C are sectional views of the semiconductor device according to the present embodiment in the steps of the method for fabricating the semiconductor device, which explain the method. The same members of the present embodiment as those of the semiconductor device according to the first embodiment and the method for fabricating the semiconductor device shown in FIGS. 1A to 14C are represented by the same reference numbers not to repeat or to simplify their explanation.

(The Semiconductor Device)

The semiconductor device according to the present embodiment includes insulation films 16a, 28a formed of a material different from that of the insulation films 16, 28 of the semiconductor device according to the first embodiment. Specifically, the insulation films 16a, 28a are formed of $Si_3N_4$.

The top parts of the insulation films 16a, 28a are etched by an about 20 nm-depth with respect to the surface of the inter-layer insulation film 40, forming a concavity 42a.

An interconnection electrode 44a of TiN is buried in the concavity 42a.

The semiconductor device according to the present embodiment has such structure.

(Method for Fabricating the Semiconductor Device)

Next, the method for fabricating the semiconductor device according to the present embodiment will be explained with reference to FIGS. 16A to 16C.

First, the steps up to the step of etching a dummy gate electrode 48 in a region 14a for a p-channel MISFET including the step are the same as those of the method for fabricating the semiconductor device according to the first embodiment shown in FIGS. 3A to 4C, and their explanation is not repeated.

Figure 16A:
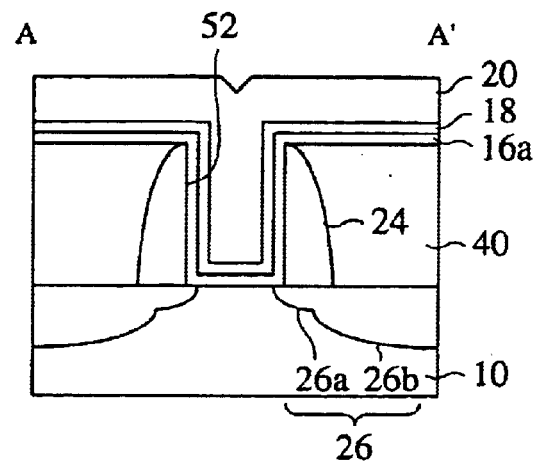
FIGS. 16A to 16C are sectional views of the semiconductor device according to the second embodiment of the present invention in the steps of the method for fabricating the same, which explain the method (Part 1).
Figure 16B:
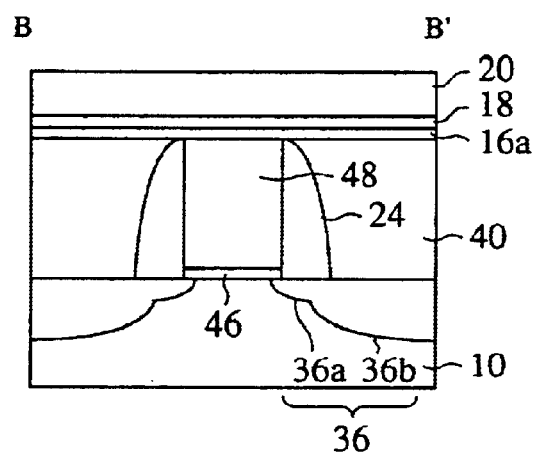
Figure 16C:
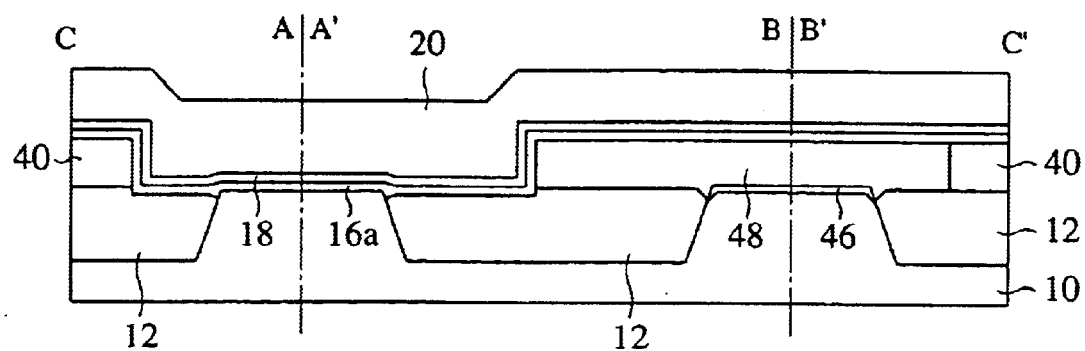

Then, the insulation film 16a of a 5 nm-thickness $Si_3N_4$ is formed on the entire surface by CVD (see FIGS. 16A to 16C).

The following steps up to the step of etching the dummy gate electrode 48 in a region 14b for an n-channel MISFET to be formed in are the same as those of the method for fabricating the semiconductor device according to the first embodiment shown in FIGS. 6A to 7C, and their explanation is not repeated.

Figure 17A:
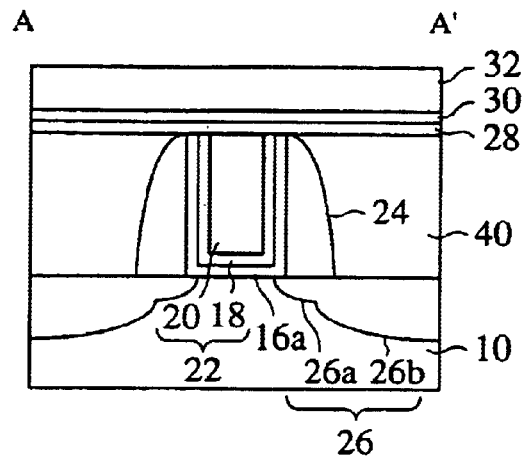
FIGS. 17A to 17C are sectional views of the semiconductor device according to the second embodiment of the present invention in the steps of the method for fabricating the same, which explain the method (Part 2).
Figure 17B:
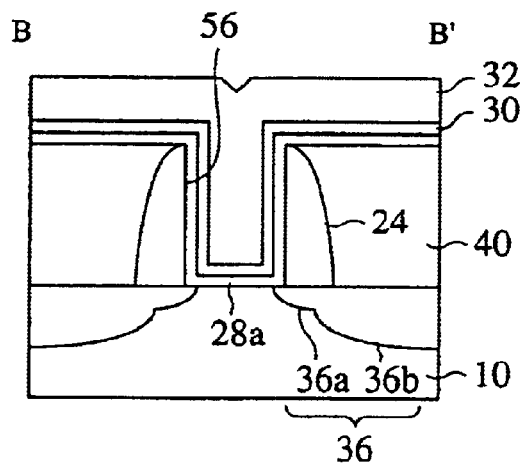
Figure 17C:
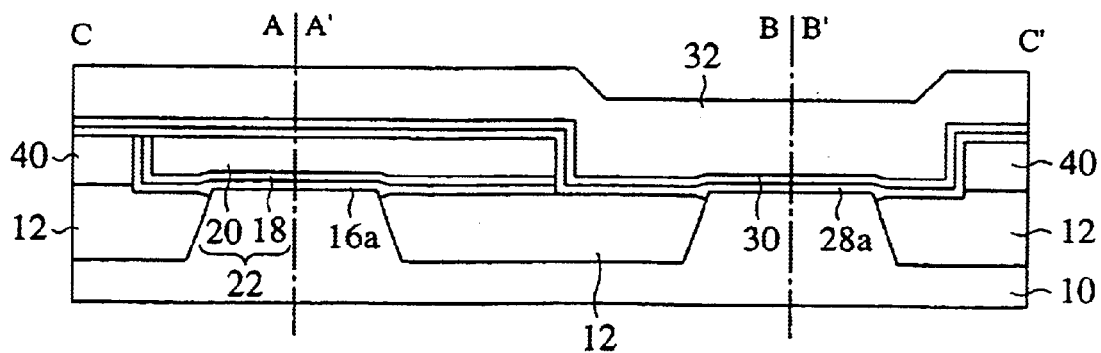
Figure 18A:
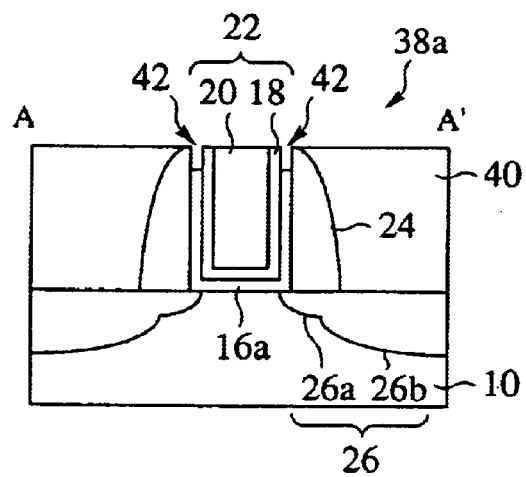
FIGS. 18A to 18C are sectional views of the semiconductor device according to the second embodiment of the present invention in the steps of the method for fabricating the same, which explain the method (Part 3).
Figure 18B:
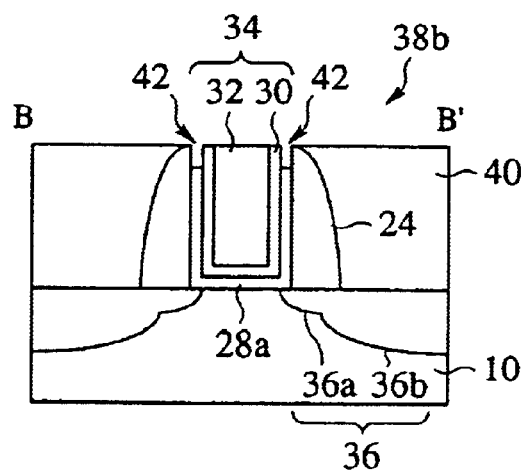
Figure 18C:
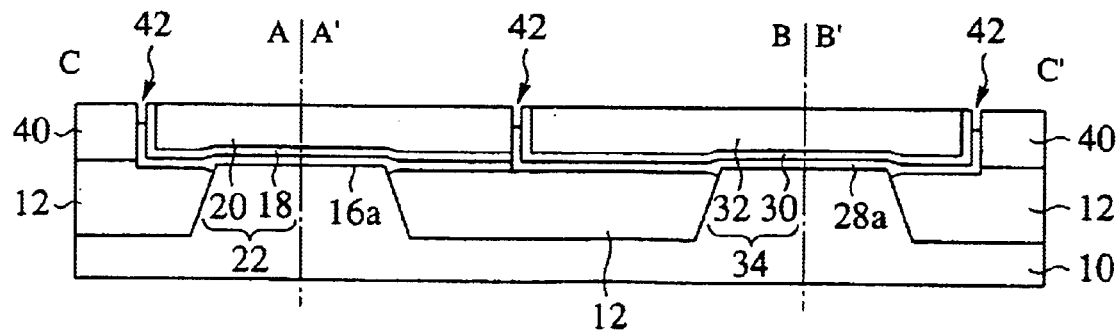

Next, the insulation film 28a of a 5 nm-thickness $Si_3N_4$ is formed on the entire surface by CVD (see FIGS. 17A to 17C).

The following steps of forming the gate electrode 34 are the same as those of the method for fabricating the semiconductor device according to the first embodiment shown in FIGS. 9A to 9C, and their explanation is not repeated.

Then, the insulation films 16a, 28a are etched by an about 20 nm-depth with respect to the surface of the inter-layer insulation film 40 by dry etching. Thus the concavity of an about 20 nm-depth is formed (see FIGS. 18A to 18C).

Figure 19A:
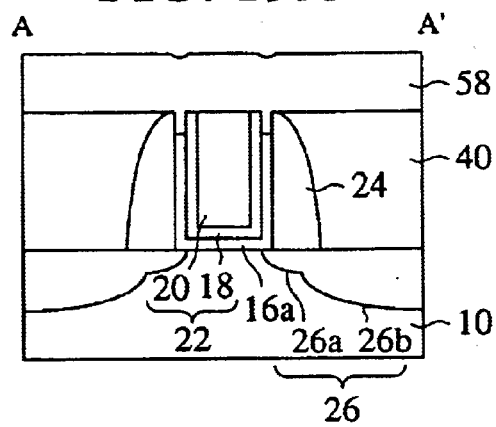
FIGS. 19A to 19C are sectional views of the semiconductor device according to the second embodiment of the present invention in the steps of the method for fabricating the same, which explain the method (Part 4).
Figure 19B:
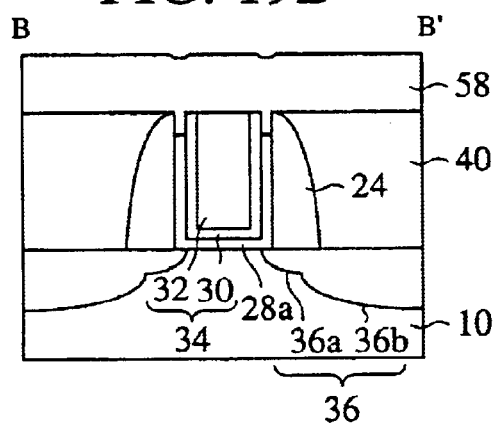
Figure 19C:
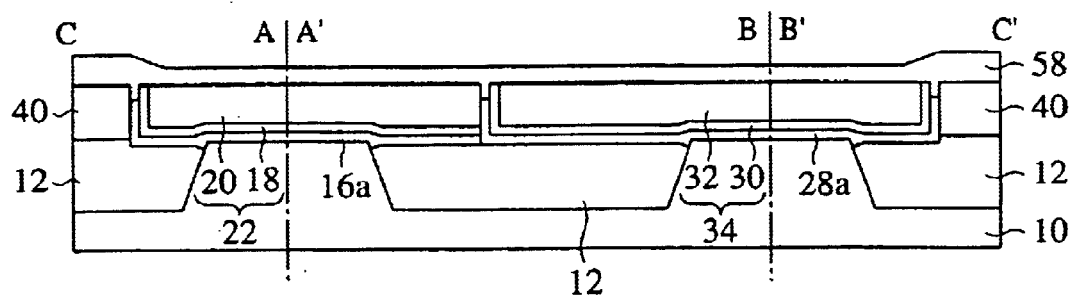
Figure 20A:
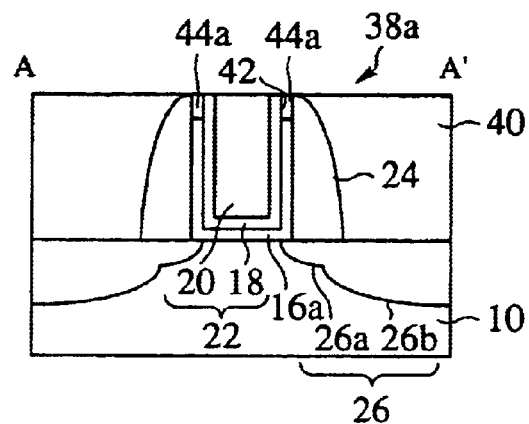
FIGS. 20A to 20C are sectional views of the semiconductor device according to the second embodiment of the present invention in the steps of the method for fabricating the same, which explain the method (Part 5).
Figure 20B:
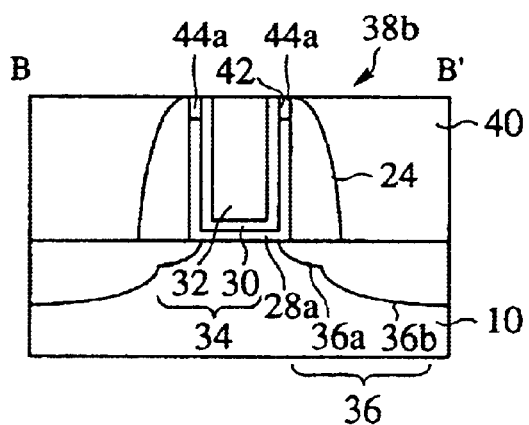
Figure 20C:
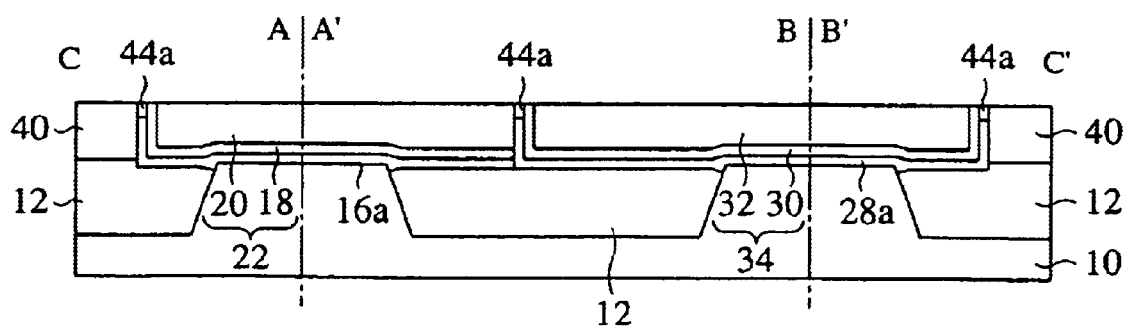

Then, a 100 nm-thickness TiN film 58 is formed on the entire surface by CVD (see FIGS. 19A to 19B).

Next, the TiN film 58 is polished by CMP until the surface of the inter-layer insulation film is exposed. Thus, the interconnection electrode 44a of the TiN film 58 is buried in the concavity 42 (see FIGS. 20A to 20C).

The semiconductor device according to the present embodiment is thus fabricated.

As described above, according to the present embodiment, the top parts of the insulation films 16a, 28a are etched to thereby form the concavity 42a, and the interconnection electrode 44a is buried in the concavity 42a. Even in such structure, the interconnection electrode 44a buried in the concavity 42a electrically interconnects the gate electrode 22 and the gate electrode 34 with each other, whereby the present embodiment can provide the same semiconductor device as the first embodiment.

(Modified Embodiments)

The present invention is not limited to the above-described embodiments and can cover other various modifications.

Figure 21:
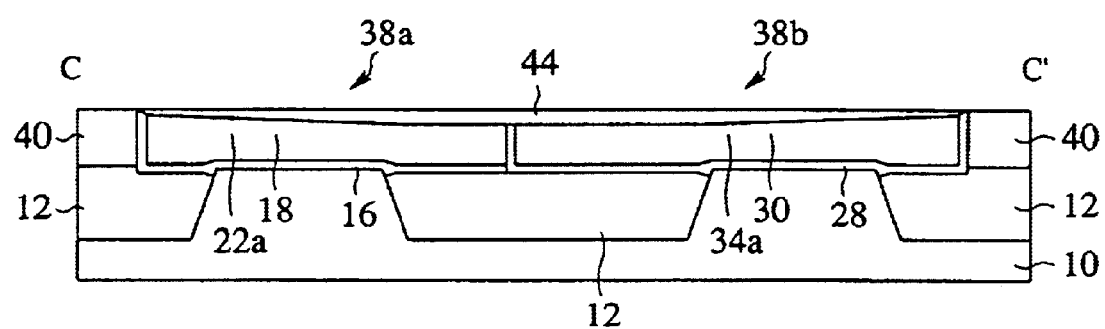
FIG. 21 is a sectional view of the semiconductor device according to the first embodiment, which includes the gate electrodes of a single-layer structure.
Figure 22:
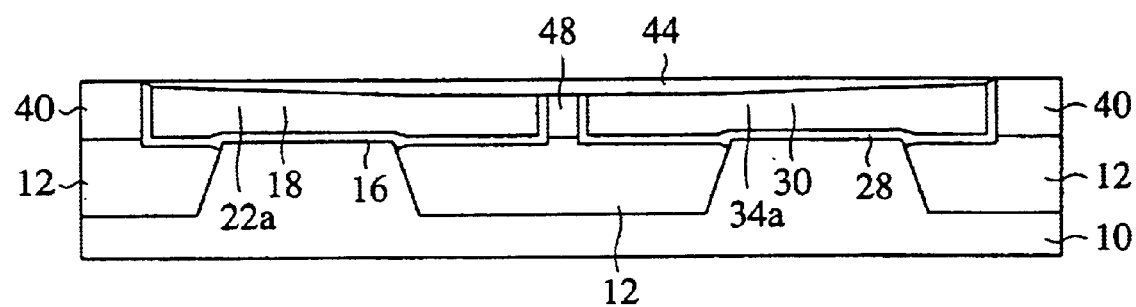
FIG. 22 is a sectional view of the semiconductor device according to a modification of the first embodiment, which includes the gate electrodes of the single-layer structure.
Figure 23:
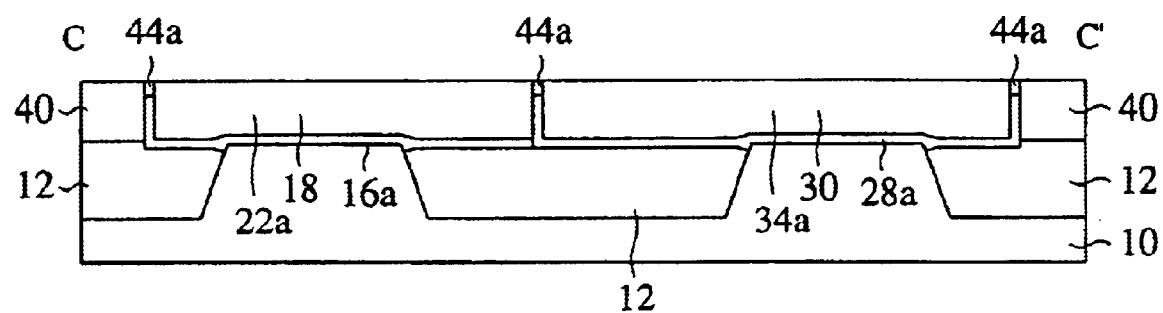
FIG. 23 is a sectional view of the semiconductor device according to the second embodiment, which includes the gate electrodes of the single-layer structure.
Figure 24A:
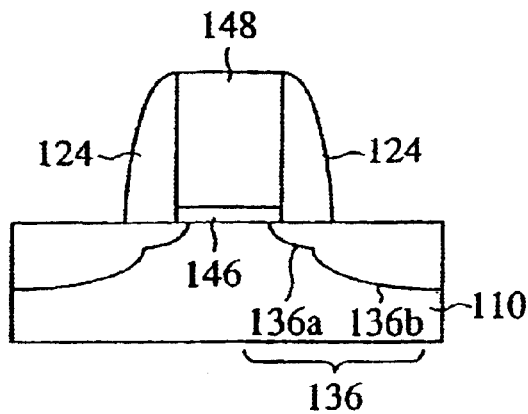
FIGS. 24A to 24C are sectional views of the semiconductor device in the steps of the proposed method for fabricating the semiconductor device, which show the method (Part 1).
Figure 24B:
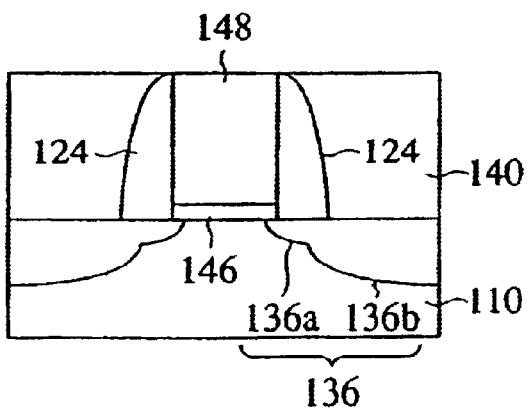
Figure 24C:
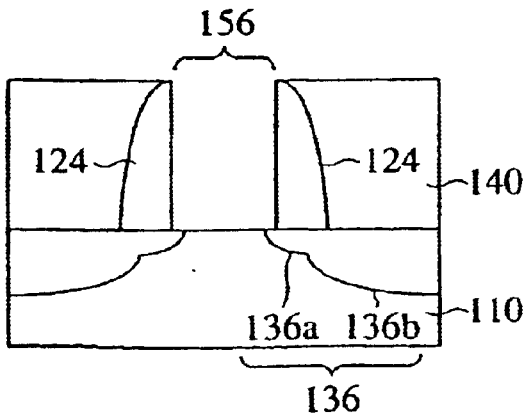
Figure 25A:
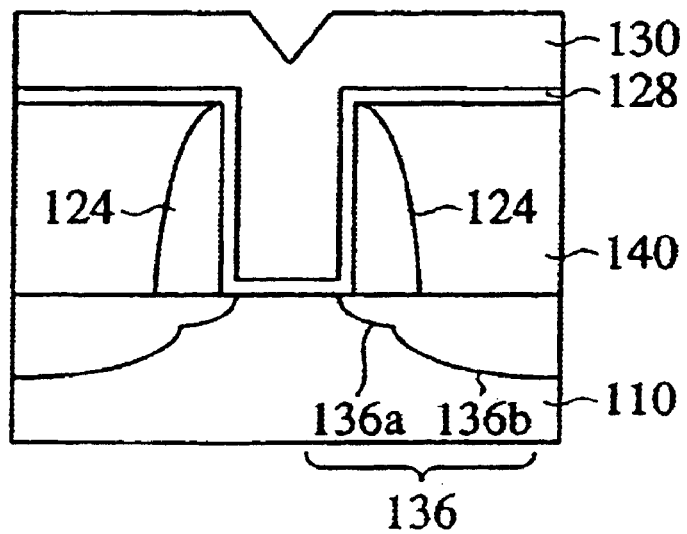
FIGS. 25A and 25B are sectional views of the semiconductor device in the steps of the proposed method for fabricating the semiconductor device, which show the method (Part 2).
Figure 25B:
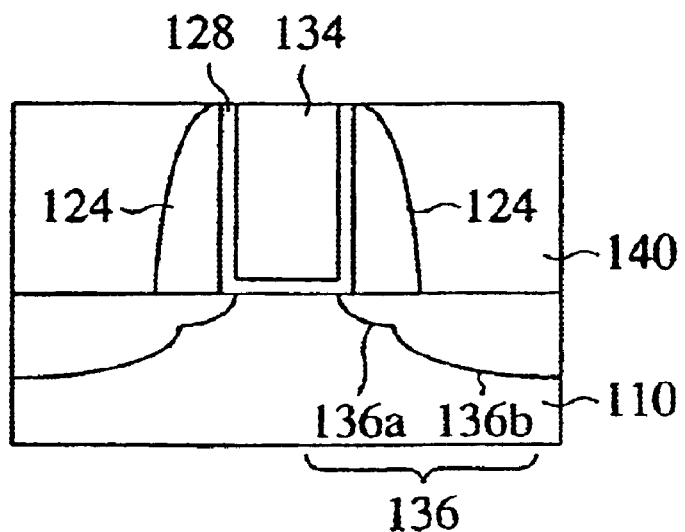
Figure 26:
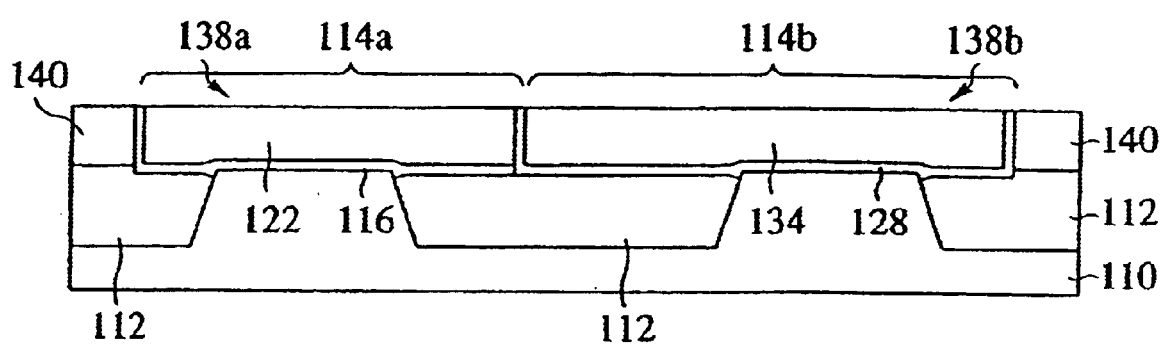
FIG. 26 is a sectional view of a semiconductor device of the dual gate structure fabricated by the proposed method.

For example, in the above-described embodiments, the gate electrodes have the layer structure. However, the gate electrodes do not essentially have the layer structure and may have a single layer structure. FIG. 21 is a sectional view of the semiconductor device according to the first embodiment shown in FIGS. 1A to 1C, which includes the gate electrodes of the single layer structure. The gate electrode 22a of the p-channel MISFET 38a is formed of a Pt film 18 alone, and the gate electrode 34a of the n-channel MISFET 38b is formed of a TiN film 30 alone. FIG. 22 is a sectional view of the semiconductor device according to the modification of the first embodiment shown in FIGS. 13A to 13C, which includes the gate electrodes have the single layer structure. FIG. 23 is a sectional view of the semiconductor device according to the second embodiment shown in FIGS. 15A to 15C, which includes the gate electrodes of the single layer structure.

In the above-described embodiments, the insulation films 16, 28 are formed of $Ta_2O_5$ film but may not be formed essentially of $Ta_2O_5$ film. The insulation films 16, 28 may be formed of, e.g., $Si_3N_4$ film, $Al_2O_3$ film, $ZrO_2$ film, $ZrSiO_2$ film, $HfO_2$ film, $HfSiO_2$ film or others.

In the above-described embodiments, the gate electrodes 22, 34 are formed of tungsten film 20, 32 but are not formed essentially of tungsten film. The gate electrodes 22, 34 may be formed of, e.g., Al film or others.

In the above-described embodiments, the gate electrode 22 of the p-channel MISFET 38a is formed of Pt of an about 5.3 eV work function but may not be essentially formed of Pt. The gate electrode 22 may be formed of any material as long as the material has a work function suitable for the material of the gate electrode of the p-channel MISFET 38a. For example, Re (Rhenium) of an about 5.0 eV work function, Ir (Iridium) of an about 4.8 eV work function, Pd (Palladium) of an about 4.8 eV work function, Rh (Rhodium) of an about 4.8 eV work function or others may be used.

In the above-described embodiments, the gate electrode 34 of the n-channel MISFET 38b is formed of TiN of an about 3.7 eV work function but is not formed essentially of TiN. The gate electrode 34 of the n-channel MISFET 38b can be formed of any material as long as the material has a work function suitable for the material of the gate electrode 34. For example, Al of an about 4.2 eV work function, NbN (Nb: Niobium) of a 3.9 eV work function, In (Indium) of a 4.2 eV work function or others may be used.

In the above-described embodiments, the interconnection electrode is formed of TiN but is not formed essentially of TiN. The interconnection electrode may be formed suitably of a multi-layer film of, e.g., Ti and TiN.

In the above-described embodiments, silicon substrates are used, but silicon substrates are not essential. Any semiconductor substrate may be used.

In the above-described embodiments, the gate electrodes are formed of metal-based materials but may be formed of any material other than metal-based materials.

INDUSTRIAL APPLICABILITY

The present invention is applicable to semiconductor devices and method for fabricating the semiconductor devices, and are useful specifically for semiconductor devices having the gate electrodes formed of a metal-based material and method for fabricating the semiconductor devices.

What is claimed is:

1. A method for fabricating a semiconductor device comprising the steps of:

forming a dummy gate electrode in a first region and a second region on a semiconductor substrate;

forming a first insulation film for covering the side wall of the dummy gate electrode on the semiconductor substrate;

etching the dummy gate electrode in the first region to form in the first region a first opening down to the semiconductor substrate;

forming a second insulation film in the first opening;

forming a first gate electrode in the first opening with the second insulation film formed on;

etching the dummy gate electrode in the second region to form in the second region a second opening down to the semiconductor substrate;

forming a third insulation film in the second opening;

forming a second gate electrode which is different from the first gate electrode in the second opening with the third insulation film formed on;

removing top parts of the first gate electrode, the third insulation film and the second gate electrodes to form a concavity; and burying in the concavity an interconnection electrode electrically interconnecting the first gate electrode and the second gate electrode.

2. A method for fabricating a semiconductor device according to claim 1, wherein in the step of forming the concavity, the top parts of the first gate electrode, the third insulation film and the second gate electrode are removed by polishing.

3. A method for fabricating a semiconductor device comprising the steps of:

forming a dummy gate electrode in a first region and a second region on a semiconductor substrate;

forming a first insulation film for covering the side wall of the dummy gate electrode on the semiconductor substrate;

etching the dummy gate electrode in the first region to form in the first region a first opening down to the semiconductor substrate;

forming a second insulation film in the first opening;

forming a first gate electrode in the first opening with the second insulation film formed on;

etching the dummy gate electrode in the second region to form in the second region a second opening down to the semiconductor substrate;

forming a third insulation film in the second opening;

forming a second gate electrode which is different from the first gate electrode in the second opening with the third insulation film formed on;

etching a top part of the third insulation film between the first gate electrode and the second gate electrode to form a concavity; and burying in the concavity an interconnection electrode for electrically interconnecting the first gate electrode and the second gate electrode.

4. A method for fabricating a semiconductor device according to claim 1, wherein in the step of forming the first gate electrode or forming the second gate electrode, the first gate electrode or the second gate electrode including a film of a metal or a compound of the metal is formed.

5. A method for fabricating a semiconductor device according to claim 2, wherein in the step of forming the first gate electrode or forming the second gate electrode, the first gate electrode or the second gate electrode including a film of a metal or a compound of the metal is formed.

6. A method for fabricating a semiconductor device according to claim 3, wherein in the step of forming the first gate electrode or forming the second gate electrode, the first gate electrode or the second gate electrode including a film of a metal or a compound of the metal is formed.

* * * * *